(12) United States Patent
Sculler et al.

(10) Patent No.: US 8,550,415 B2
(45) Date of Patent: Oct. 8, 2013

(54) ADJUSTABLE FLAT PANEL DISPLAY MOUNTING SYSTEM

(75) Inventors: Steven J. Sculler, Morganville, NJ (US); Steven R. Remy, New York, NY (US)

(73) Assignee: Bell'O International Corp., Morganville, NJ (US)

( * ) Notice: Subject to any disclaimer, the term of this patent is extended or adjusted under 35 U.S.C. 154(b) by 287 days.

(21) Appl. No.: 12/915,227

(22) Filed: Oct. 29, 2010

(65) Prior Publication Data
US 2012/0104205 A1    May 3, 2012

(51) Int. Cl.
*E04G 3/00* (2006.01)
*F16M 13/02* (2006.01)

(52) U.S. Cl.
CPC ............. *F16M 13/02* (2013.01); *Y10S 248/917* (2013.01)
USPC ...................... 248/298.1; 248/291.1; 248/495; 248/917

(58) Field of Classification Search
USPC ........ 248/291.1, 298.1, 495, 475.1, 489, 490, 248/496, 292.14, 294.1, 918; 361/679.02, 361/679.21
See application file for complete search history.

(56) References Cited

U.S. PATENT DOCUMENTS

| | | | |
|---|---|---|---|
| 2,509,424 A | 5/1950 | Denton | |
| 2,522,901 A | 9/1950 | Schrager et al. | |
| 2,697,572 A | 12/1954 | Phankuch | |
| 2,877,687 A * | 3/1959 | Bozin | 248/477 |
| 2,975,994 A | 3/1961 | Goss | |
| 2,983,473 A | 5/1961 | Waller et al. | |
| 3,188,028 A | 6/1965 | Waller | |
| 4,143,848 A | 3/1979 | Slemmons | |
| 4,549,713 A | 10/1985 | Magadini | |
| 5,878,987 A | 3/1999 | Hayde | |
| 5,899,430 A | 5/1999 | Malakates et al. | |
| 6,032,915 A | 3/2000 | Brindisi | |
| 6,095,479 A | 8/2000 | Brindisi | |
| 6,241,210 B1 | 6/2001 | Brindisi | |
| 6,550,739 B1 | 4/2003 | Brindisi | |
| 6,880,795 B1 | 4/2005 | Haynes, III | |
| 7,316,379 B1 | 1/2008 | Graham | |
| 7,497,411 B2 | 3/2009 | Weck et al. | |
| 7,537,189 B2 * | 5/2009 | Jung et al. | 248/298.1 |
| 7,637,465 B2 | 12/2009 | Huang | |
| 7,878,473 B1 * | 2/2011 | Oh | 248/339 |
| 7,963,489 B2 * | 6/2011 | O'Keene et al. | 248/201 |
| 2007/0023593 A1 * | 2/2007 | Fedewa | 248/201 |
| 2008/0035813 A1 * | 2/2008 | O'Keene et al. | 248/225.21 |

* cited by examiner

*Primary Examiner* — Anita M King
(74) *Attorney, Agent, or Firm* — Lerner, David, Littenberg, Krumholz & Mentlik, LLP

(57) ABSTRACT

A flat panel display mounting system includes a wall plate and at least one monitor arm assembly. The monitor arm assembly includes a monitor arm mountable to the wall plate, and a leveling assembly coupled to the monitor arm and arranged within an opening of the monitor arm. The leveling assembly is movable relative to the monitor arm within the opening and along a length of the monitor arm. The leveling assembly includes a display mounting portion adapted to mount a flat panel display thereon. The leveling assembly with the mounted display panel can be adjusted to obtain a desired location of the mounted display panel.

25 Claims, 19 Drawing Sheets

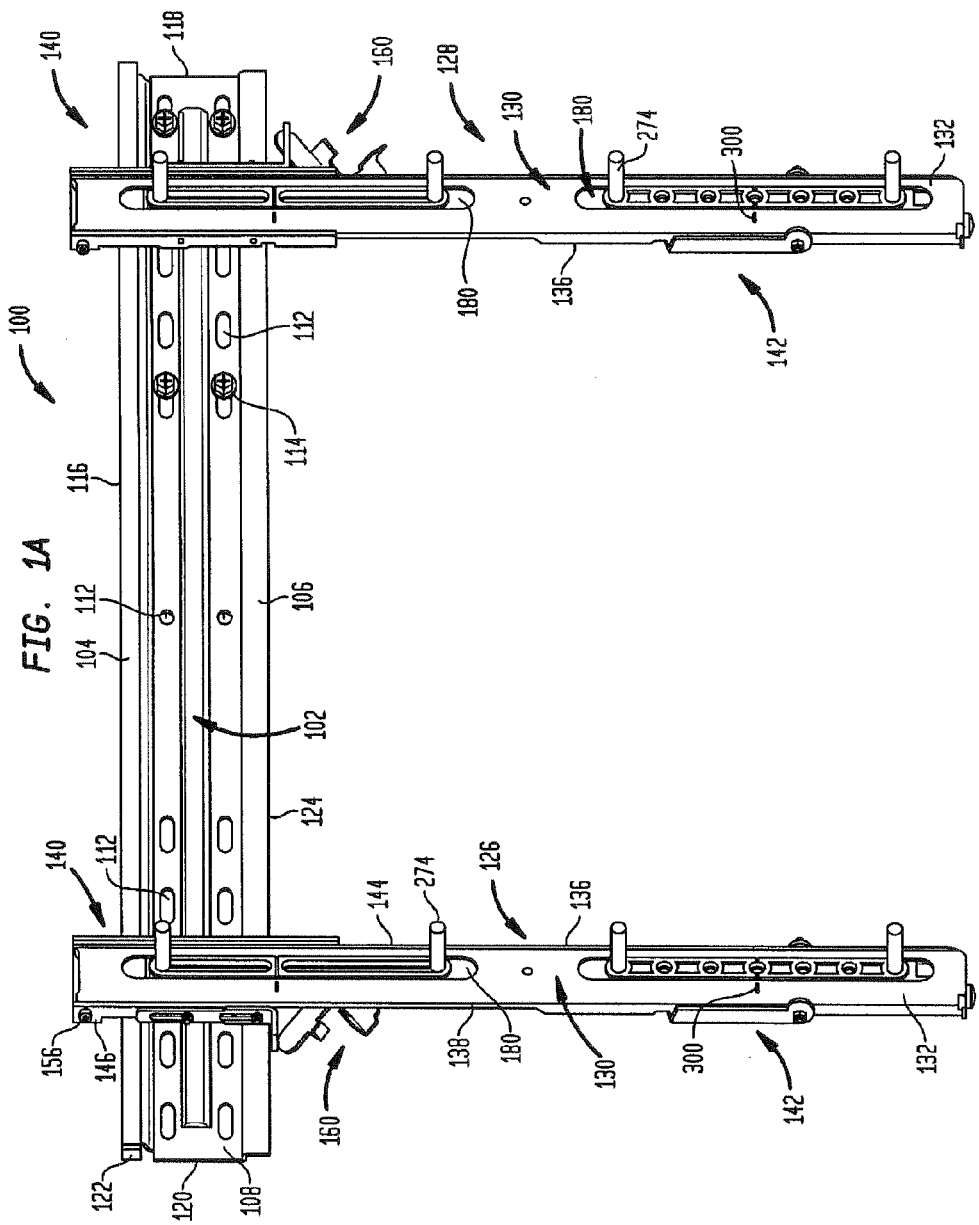

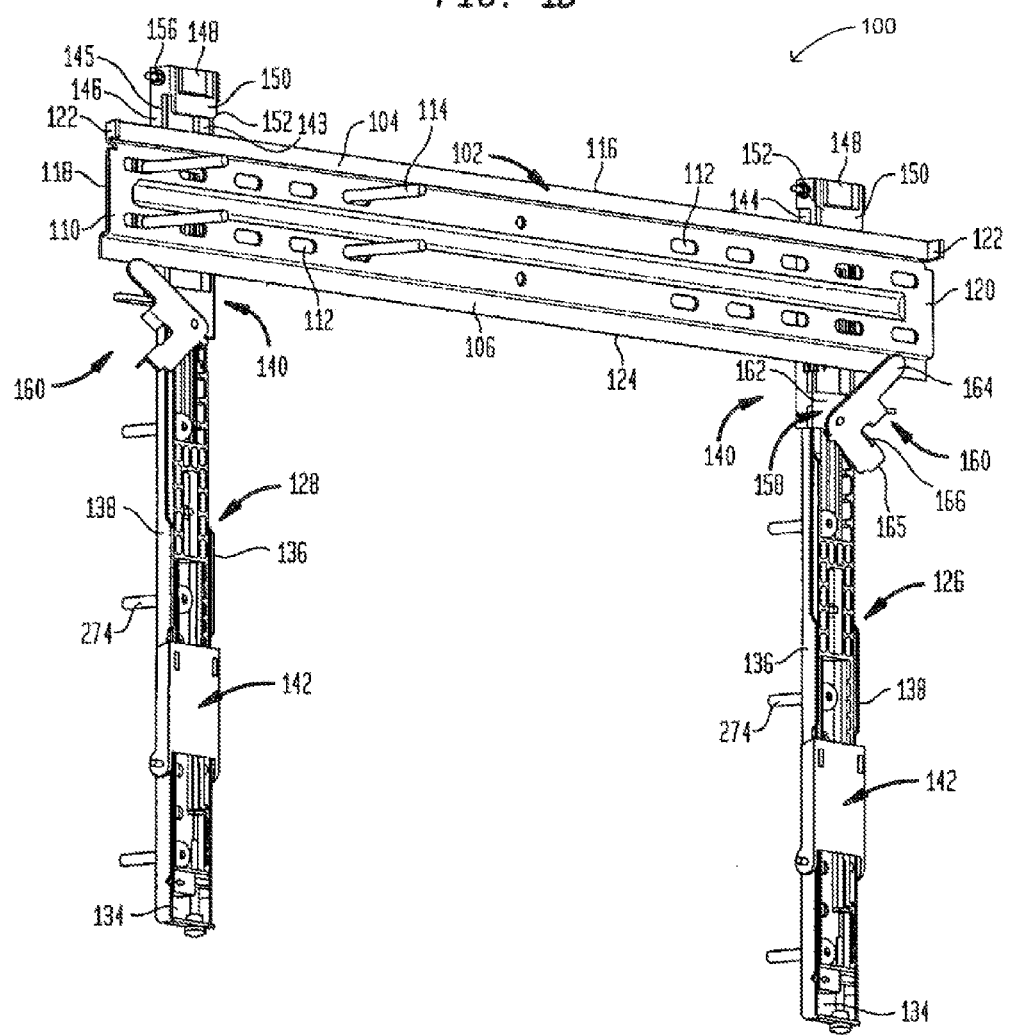

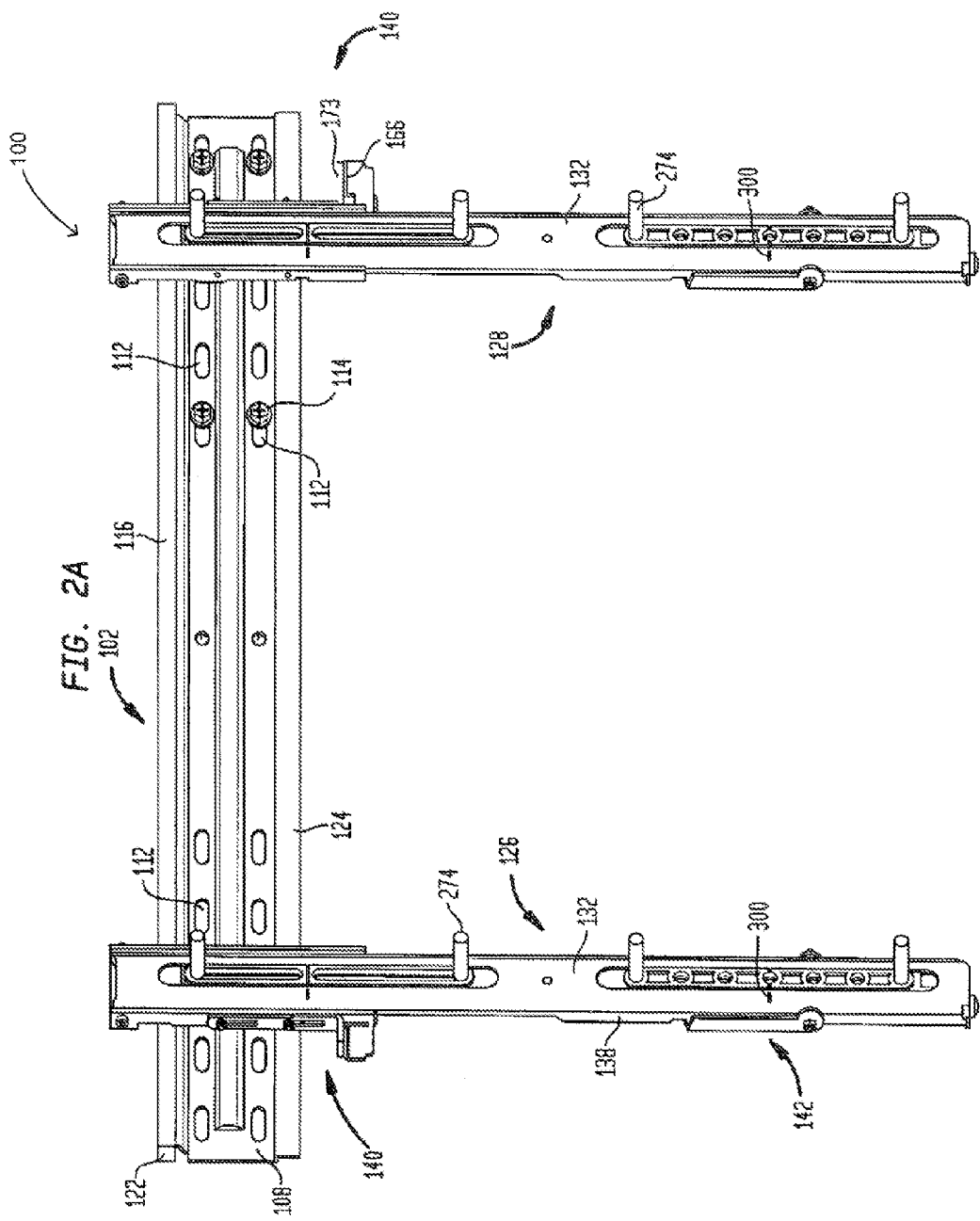

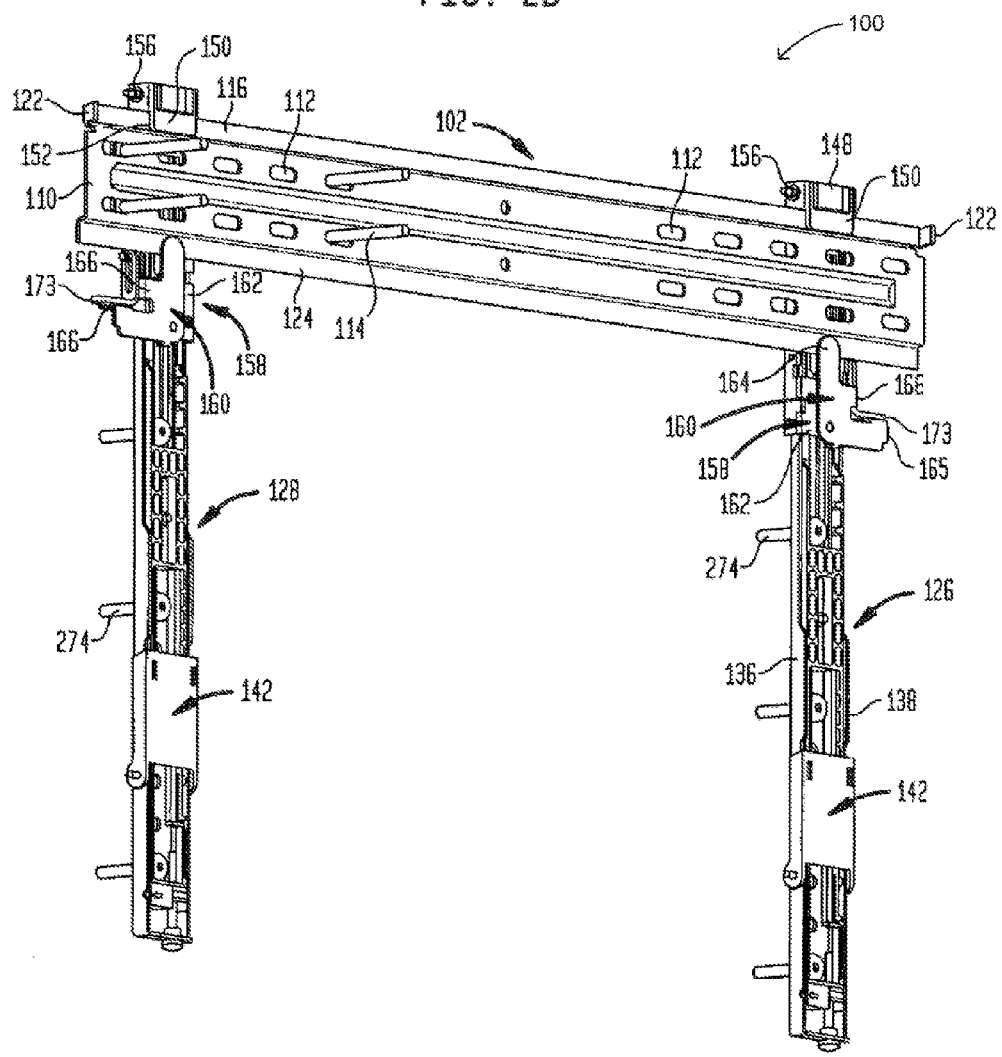

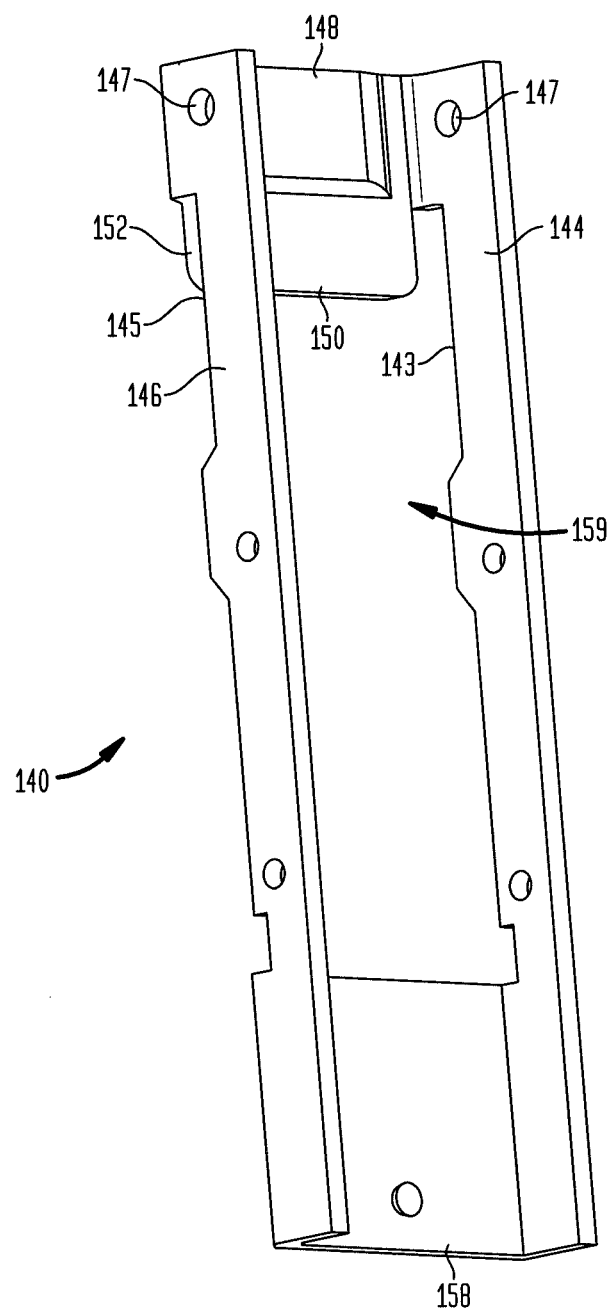

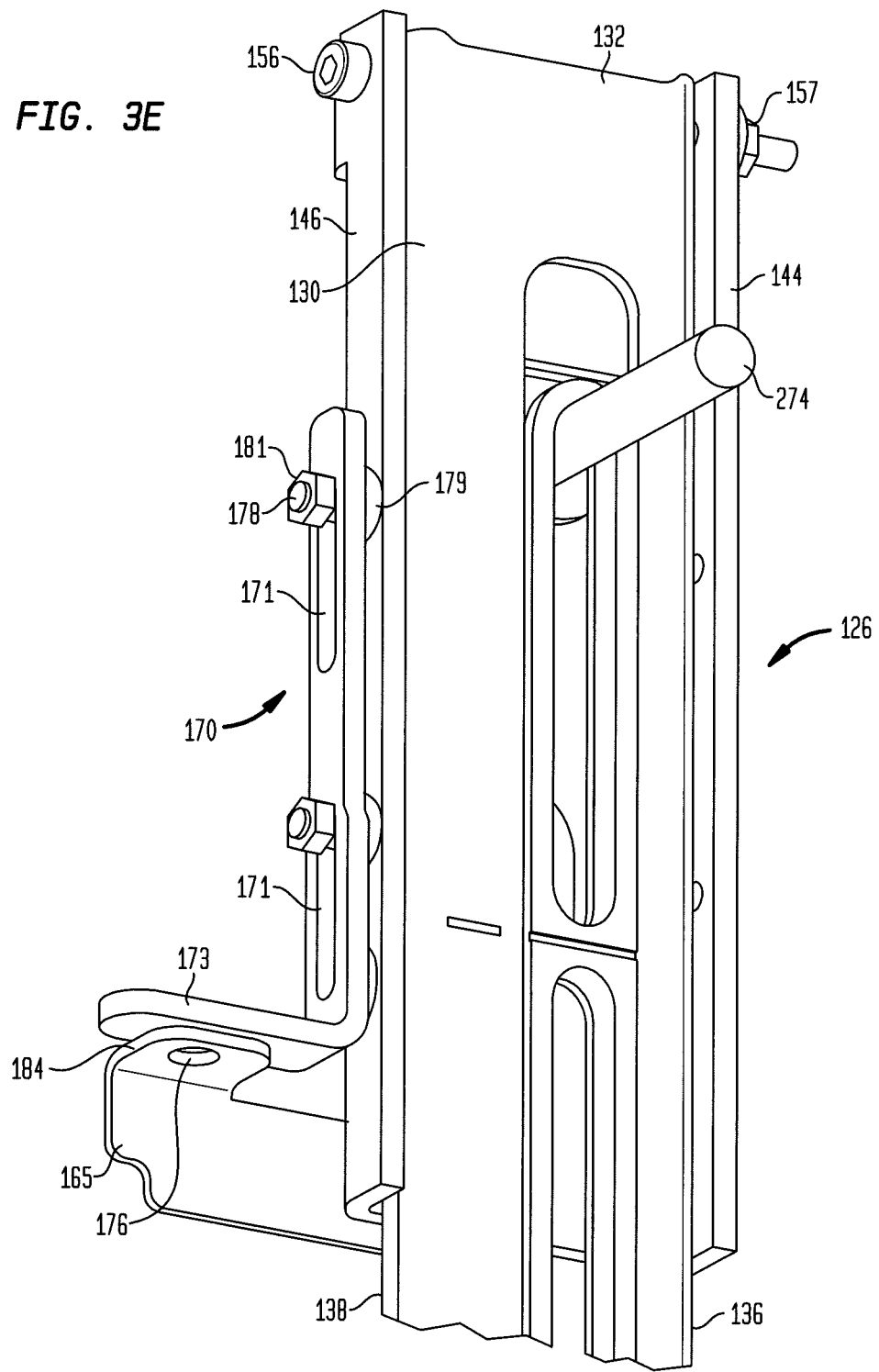

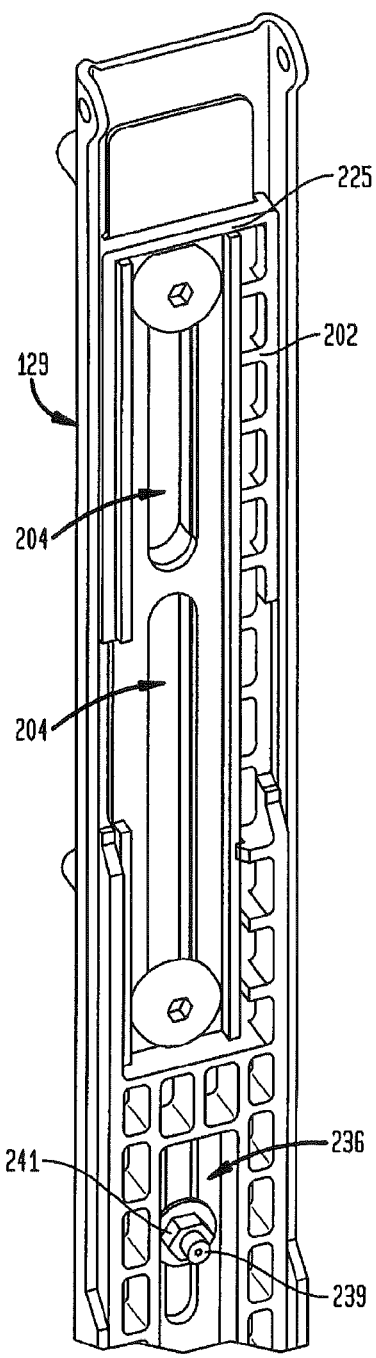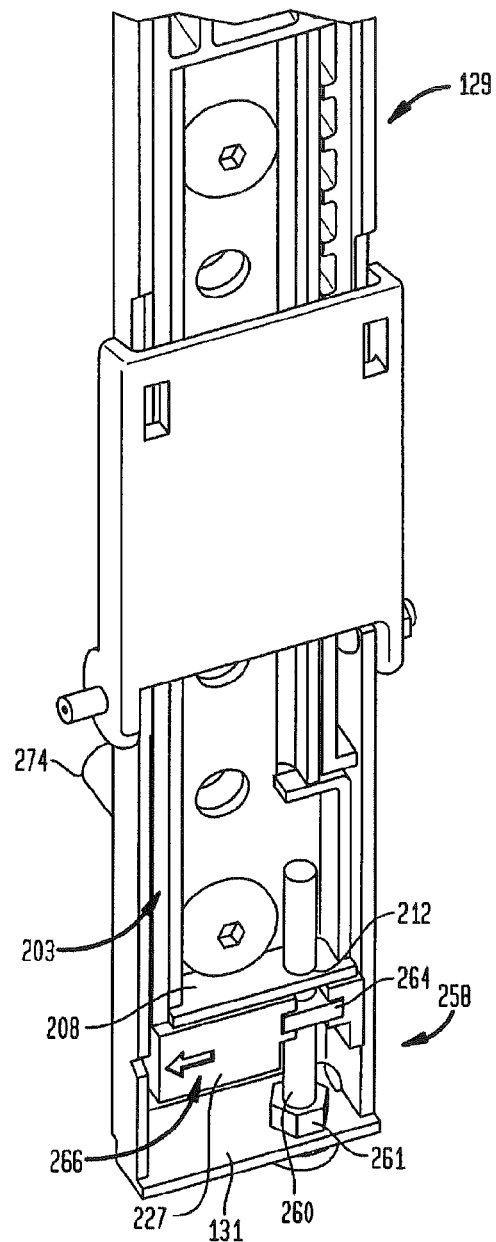

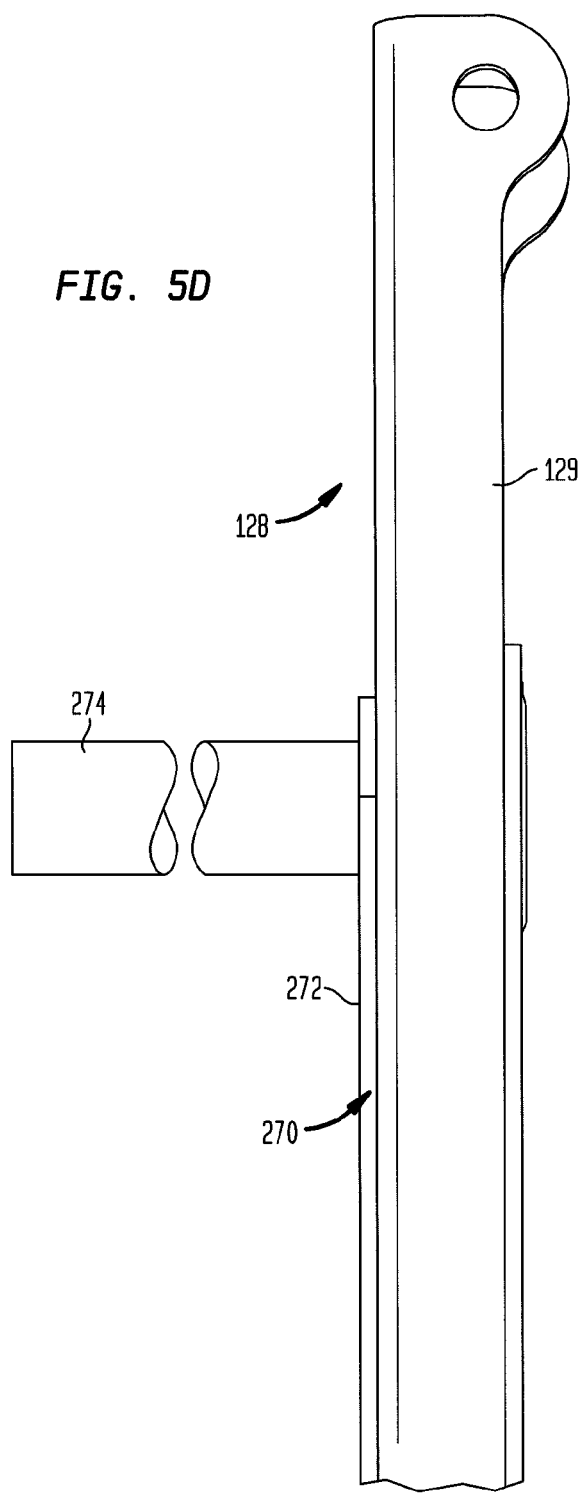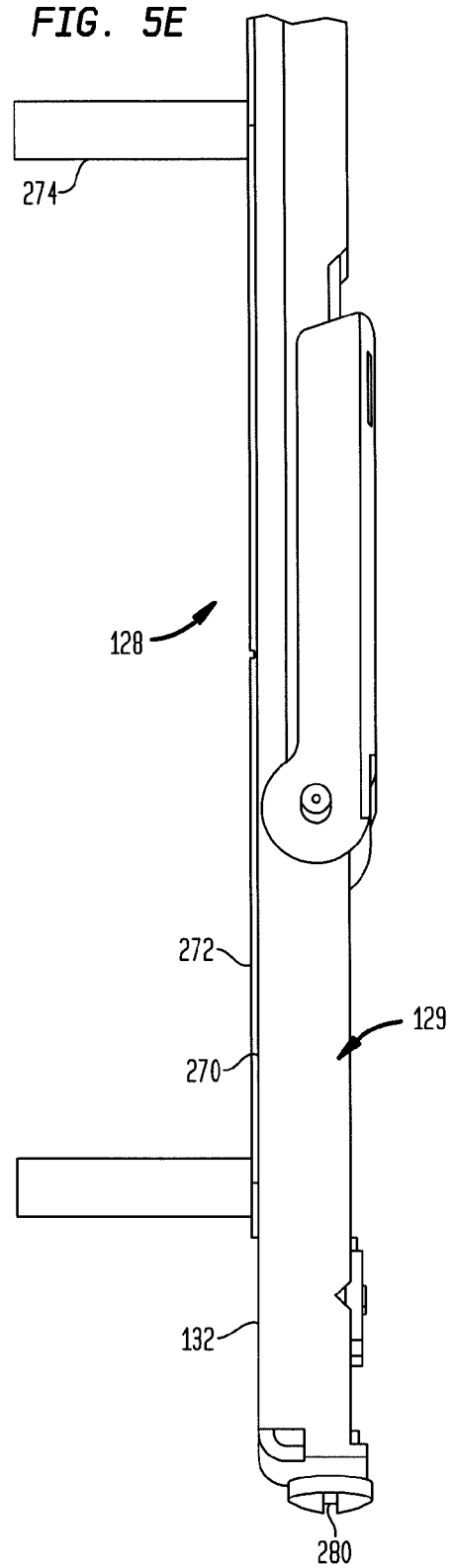

ADJUSTABLE FLAT PANEL DISPLAY MOUNTING SYSTEM

BACKGROUND OF THE INVENTION

The present invention relates to mounting a flat panel display, and more particularly relates to adjustable mounting systems for flat panel displays.

Recently, there has been a marked growth in the popularity of flat panel displays, which include flat panel televisions, pictures and flat structures suitable for mounting to a vertical surface such as a wall. Flat panel televisions presently use technologies such as liquid crystal, light emitting diode or plasma display, to provide a display screen that is much thinner and lighter than traditional cathode ray televisions or projection televisions. Flat panel televisions are also versatile in that they can be placed on a stand or mounted on numerous surfaces, such as a wall.

Typical systems for mounting a flat panel television to a wall include a wall mount, which is secured to the wall, and one or more mounting brackets, which are secured to the flat panel television. The mounting brackets, with a flat panel television secured thereto, may be engaged with the wall mount, thereby mounting the flat panel television to the wall.

In current flat panel television mounting systems, when the mounting brackets, to which the flat panel television is initially secured, are mounted to a wall mount secured to a wall, the spacing between the mounted television and the wall usually is very narrow. This spacing typically cannot be increased substantially while the television is maintained mounted to the wall mount by the mounting brackets. Consequently, after the television is mounted to the wall mount by mounting brackets, an installer often has difficulty accessing the space behind the television to connect cables and wires to connectors or jacks on the back surface of the television.

In addition, oftentimes a flat panel television, after being mounted to a wall mount by mounting bracket, needs to be vertically adjusted, at one or both of its sides, in relation to the wall mount, so that the flat panel television has a pleasing and desired horizontal leveling in relation to its environment. Components typically included with flat panel television mounting systems that permit adjustment of horizontal leveling of the television, however, are difficult to access and use to achieve a desired horizontal leveling after the television is mounted to the wall mount.

Thus, a need exists for a flat panel display mounting system that provides ease of access to a back surface of a mounted flat panel television, and also ease of adjustment of horizontal leveling of the flat panel television, after the flat panel television is mounted to a wall or other vertical surface.

SUMMARY OF TEE INVENTION

In accordance with an aspect of the invention, a flat panel display mounting system may include a mounting element, such as a wall plate, and a monitor arm assembly. The monitor arm assembly may include a monitor arm mountable to the mounting element, where the monitor arm has an opening, and a leveling assembly coupled to the monitor arm and arranged within the opening thereof. The leveling assembly may be movable relative to the monitor arm within the opening and along a length of the monitor arm. The leveling assembly may include a display mounting portion adapted to mount a flat panel display thereon, whereby the leveling assembly can be adjusted with the mounted display to obtain a desired location of the mounted display.

In accordance with another aspect of the invention, a flat panel display mounting system may include a mounting element, such as a wall plate, and a monitor arm assembly. The monitor assembly may include a monitor arm mountable to the mounting element and having an opening, and a leveling assembly longitudinally extending between first and second ends and arranged within the opening of the monitor arm. The leveling assembly may include a portion disposed centrally between the first and second ends and having a longitudinally extending slot at which the monitor arm is coupled to the leveling assembly. The leveling assembly may be movable relative to the monitor arm within the opening and along a length of the monitor arm. The leveling assembly may include a display mounting portion disposed between the portion with the slot and the first end or the second end and adapted to mount a flat panel display thereon, whereby the leveling assembly can be adjusted with the mounted display to obtain a desired location of the mounted display.

In accordance with another aspect of the invention, a television mounting system may include a mounting element, such as a wall plate, and at least one monitor arm assembly mountable on the mounting element. The monitor arm assembly may include a monitor arm engageable with a television display and an engagement assembly, such as a wall hook assembly, pivotally secured to one end of the monitor arm and engageable with the mounting element. The engagement assembly may be rotatable relative to the monitor arm at least about 90 degrees.

In one embodiment, the engagement assembly may include a locking assembly operable to engage the engagement assembly with the mounting element, to prevent dismounting of the mounted monitor arm assembly from the mounting element. In a further embodiment, the locking assembly may include a first locking unit to engage with the mounting element and a second locking unit to engage with the first locking unit to prevent dismounting of the mounted monitor arm assembly from the mounting element. In another embodiment, the first locking unit may include a rotatable element rotatable to engage with and disengage from the mounting element and, when the second locking unit is engaged with the rotatable element of the first locking unit and the rotatable element is engaged with the mounting element, the second locking unit prevents rotation of the rotatable element of the first locking unit to disengage from the mounting element.

BRIEF DESCRIPTION OF THE DRAWINGS

FIGS. 1A and 1B show an exploded view of an exemplary flat panel display mounting system, in accordance with an aspect of the present invention.

FIGS. 2A and 2B show the system of FIGS. 1A and 1B in an assembled configuration.

FIG. 3B shows a perspective, partial view of a wall hook assembly of the system of FIGS. 1A and 1B, in accordance with an aspect of the invention.

FIG. 3E shows an enlarged, partial view of the monitor arm assembly of the system of FIGS. 1A and 1B.

FIGS. 5B and 5C show partial views of upper and lower ends, respectively, of the monitor arm assembly of the system of FIGS. 1A and 1B.

FIGS. 5D and 5E show partial side views of upper and lower ends, respectively, of the monitor arm assembly of the system of FIGS. 1A and 1B.

DETAILED DESCRIPTION OF THE INVENTION

Figure 3A:
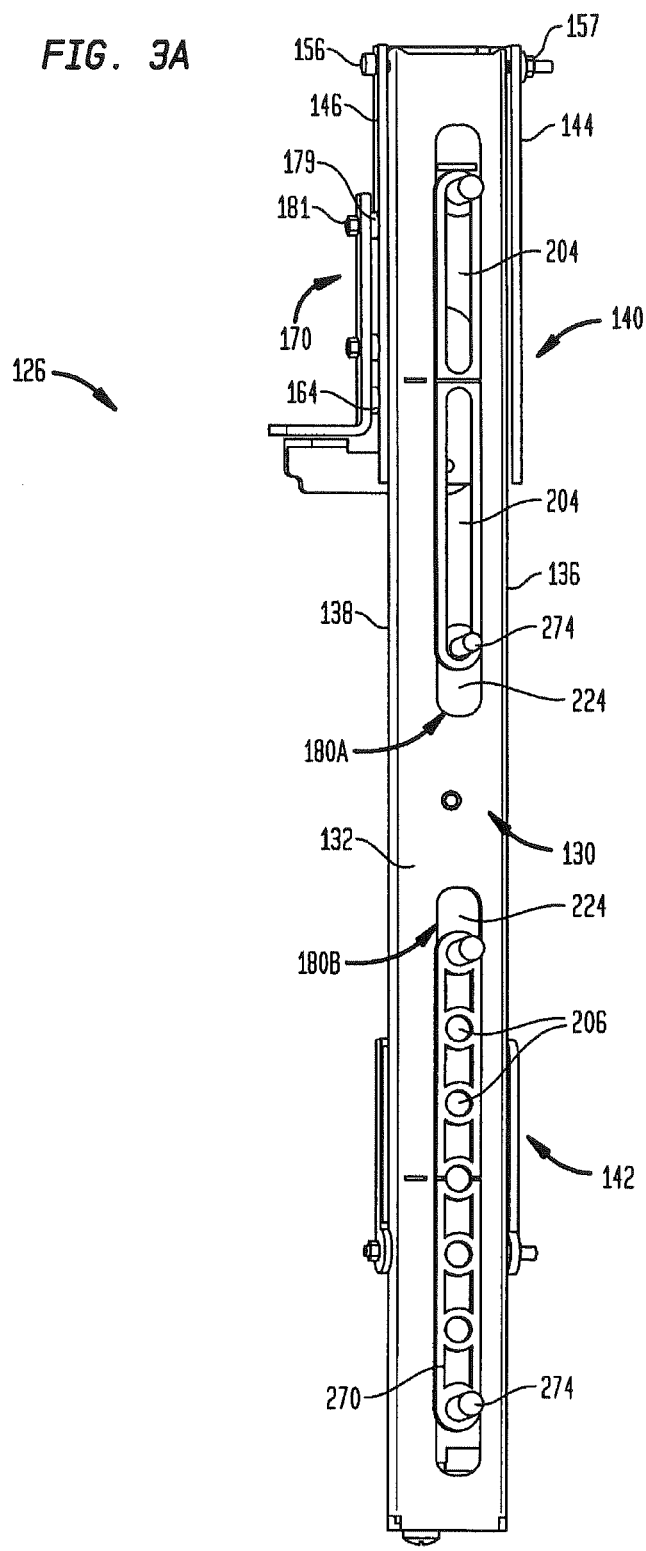
FIG. 3A shows a perspective view of a monitor arm assembly of the system of FIGS. 1A and 1B, in accordance with an aspect of the invention.

For ease of reference, in the following description of a flat panel display mounting system in accordance with aspects of the present invention, directions (upward, downward, right and left) and positions (upper or top, lower or bottom, front and back) are defined from the viewpoint of a user facing a wall surface to which a flat panel display, such as a flat panel television, may be mounted using the inventive mounting system.

In accordance with an aspect of the present invention, referring to FIGS. 1A and 1B, an exemplary flat panel display mounting system 100 includes a mounting element 102 such as a wall plate having an upper end 104, a lower end 106, a front side 108, a back side 110, a first end side 118 and a second end side 120. The wall plate 102 is desirably made of a sturdy material, such as metal. The wall plate 102 includes a plurality of mounting openings 112 disposed along the upper and lower ends 104, 106. The openings 112 may be used to secure the wall plate 102 to a wall or like surface using fastening screws 114.

The wall plate 102 includes an upper horizontal ledge 116 that extends along the upper end 104 between the first and second sides 118, 120. The ledge 116 may include a flange 122 at each side extending angularly away from the front side 108. In one embodiment, the flange 122 extends orthogonally away from the front side 108. In addition, the wall plate 102 includes a lower horizontal ledge 124 extending between the first and second sides 118, 120. The ledges 116, 124 are adapted in relation to the portion of the wall plate 102 including the openings 112 so that, when the wall plate 102 is secured to a wall surface by the screws 114 passing through the openings 112, the ledges 116, 124 are spaced from the wall surface.

Figure 5A:
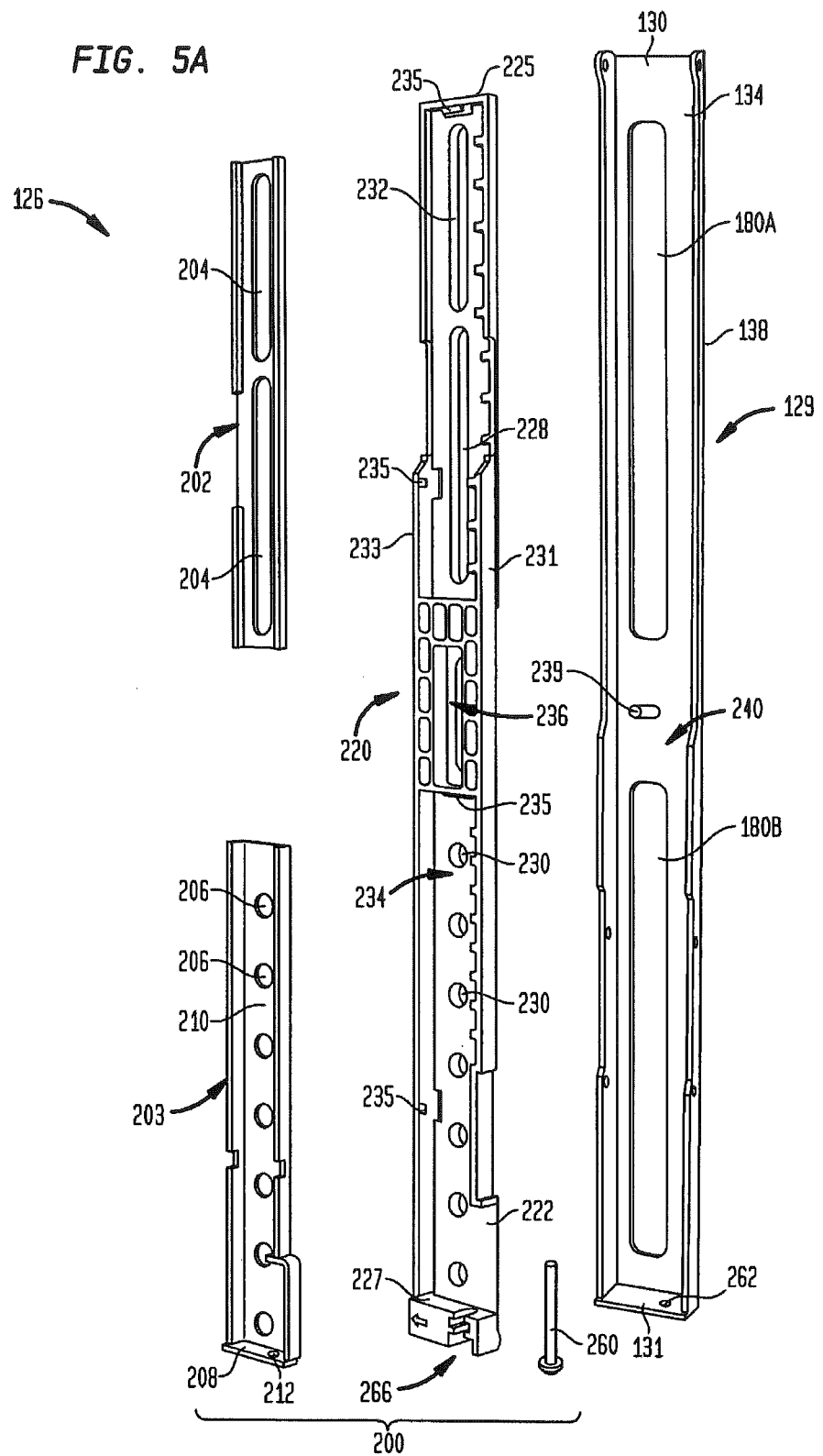
FIG. 5A shows a partial, exploded view of the monitor arm assembly of the system of FIGS. 1A and 1B.

The mounting system 100 may include monitor arm assemblies 126 and 128. Referring also to FIGS. 3A and 5A, each of the monitor arm assemblies includes a longitudinally extending monitor arm 129. The monitor arm 129 includes a back wall 130 having a front surface 132, a back surface 134 and opposing sides 136, 138 extending away from the front surface 132 of the back wall 130. The back wall 130 may include upper and lower slots 180A, 180B extending along the length of the monitor arm and spaced from each other. Bolts or screws 274 may be passed through the slots 180 to secure a back surface of a flat panel television (not shown) to the monitor arm assembly. Although only two monitor arm assemblies are shown in FIGS. 1A and 1B, in other embodiments, the mounting system may use less than two or more than two monitor arm assemblies.

Figure 3C:
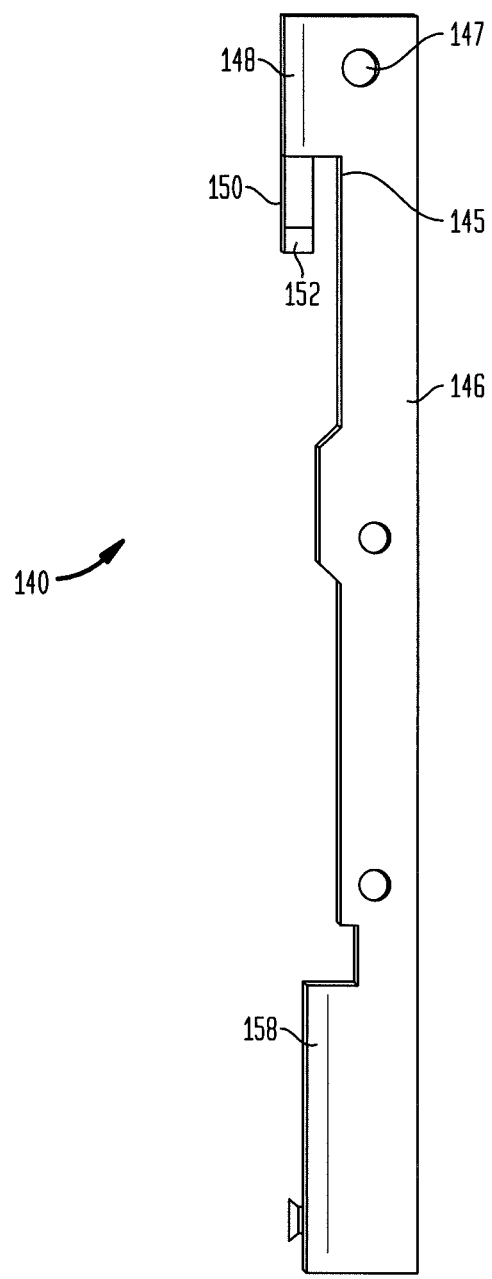
FIG. 3C shows a side view of the wall hook assembly of FIG. 3B.
Figure 3D:
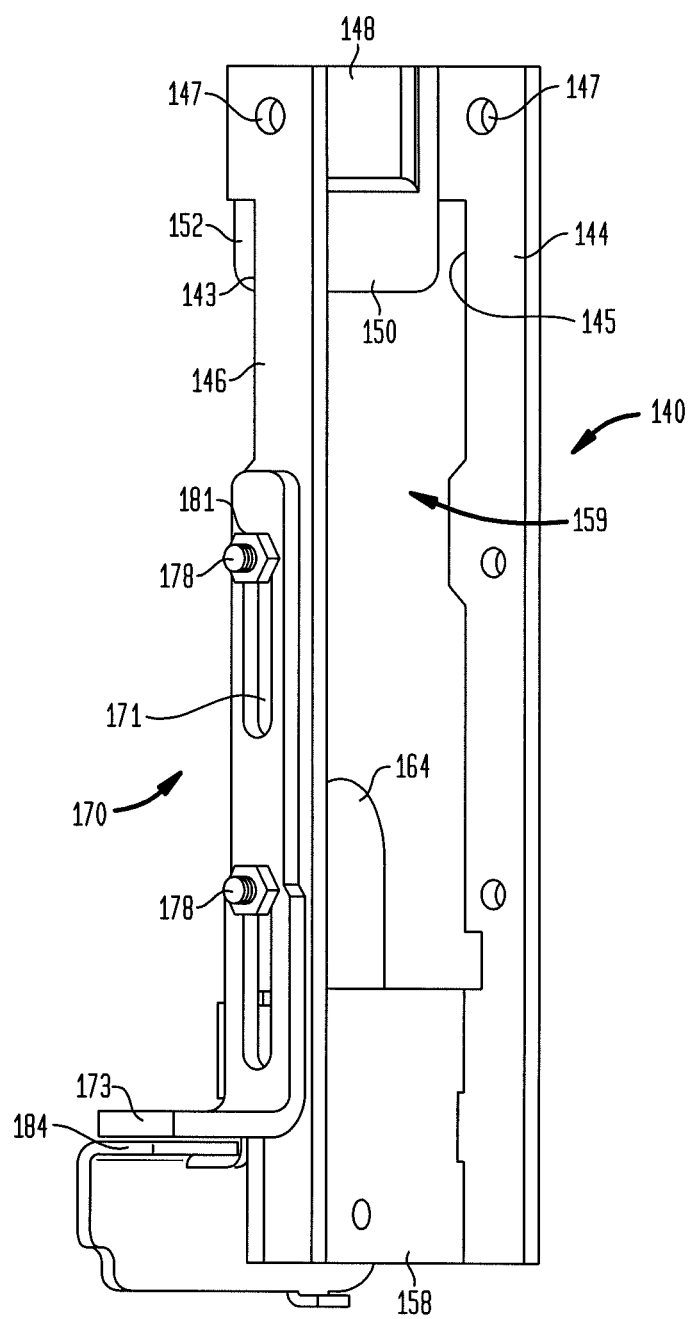
FIG. 3D shows a perspective view of a wall hook assembly of the system of FIGS. 1A and 1B, in accordance with an aspect of the invention.

Further referring to FIGS. 3B, 3C and 3E, each of the monitor arm assemblies may include an engagement assembly 140, such as a wall hook assembly adapted to be engageable with and disengageable from a mounting element, such as the wall plate 102. The wall hook assembly 140 may include opposing sides 144, 146 spaced from each other a distance slightly larger than the distance between the sides 136, 138 of the monitor arm 129. An upper back wall 148 at the upper end of the wall hook assembly 140 extends between and interconnects the sides 144, 146. The upper ends of the sides 144, 146 of the assembly 140 include respective apertures 147 aligned with each other, and the upper ends of the sides 136, 138 of the monitor arm 129 include respective apertures (not shown) aligned with each other. The apertures 147 and the apertures at the upper ends of the sides 136, 138 are adapted so that they may be aligned with one another, and a threaded bolt 156 may pass through the aligned apertures and have a nut 157 secured to its exposed end, to pivotally secure the wall hook assembly 140 to the upper end of the back wall 130 of the monitor arm 129. Based on the difference between the respective spacings between the sides 136, 138 of the monitor arm 129 and the sides 144, 146 of the wall hook assembly 140, the upper end of the monitor arm 129 may be received within an open interior area 159 of the wall hook assembly 140 defined between the sides 144, 146 and in part by the wall 148. In one embodiment, referring to FIG. 7A, the wall hook assembly 140 may be adapted to be pivotally secured to the monitor arm 129, such that the wall hook assembly 140 may be rotated about the pivot point P, which is at the respectively aligned apertures of the wall hook assembly 140 and the monitor arm 129, from a position at which the monitor arm 129 is disposed within the interior area 159 of the wall hook assembly to a position at which the wall hook assembly is at an angle of at least about A degrees relative to the monitor arm 129, where A is 90 degrees.

In one embodiment, referring to FIGS. 1B, 3B and 3C, the upper back wall 148 of the wall hook assembly may include a lip 150 that extends between the sides 144, 146 and has opposing surfaces 152 facing in the direction of the respective opposing sides of the 144, 146. The back wall 148 is adapted so that a space is defined between the lip 150 and respective back surfaces 143, 145 of the opposing sides 144, 146 of the wall hook assembly. Further referring to FIGS. 2A and 2B, the space has a thickness slightly larger than the thickness of the upper ledge 116, so that the upper ledge 116 may be snugly disposed in the space between the back surfaces of the sides 144, 146 and the lip 150. When the wall plate 102 is secured to a wall surface and the upper ledge 116 is disposed in the space between the lip 150 and sides 144, 146 of the wall hook assembly 140, the wall hook assembly 140 is engaged with the wall plate 102 at the upper ledge 116, such that the monitor arm assembly, which includes the monitor arm 129 pivotally attached to the wall hook assembly 140, is mounted to the wall plate 102.

Figure 4A:
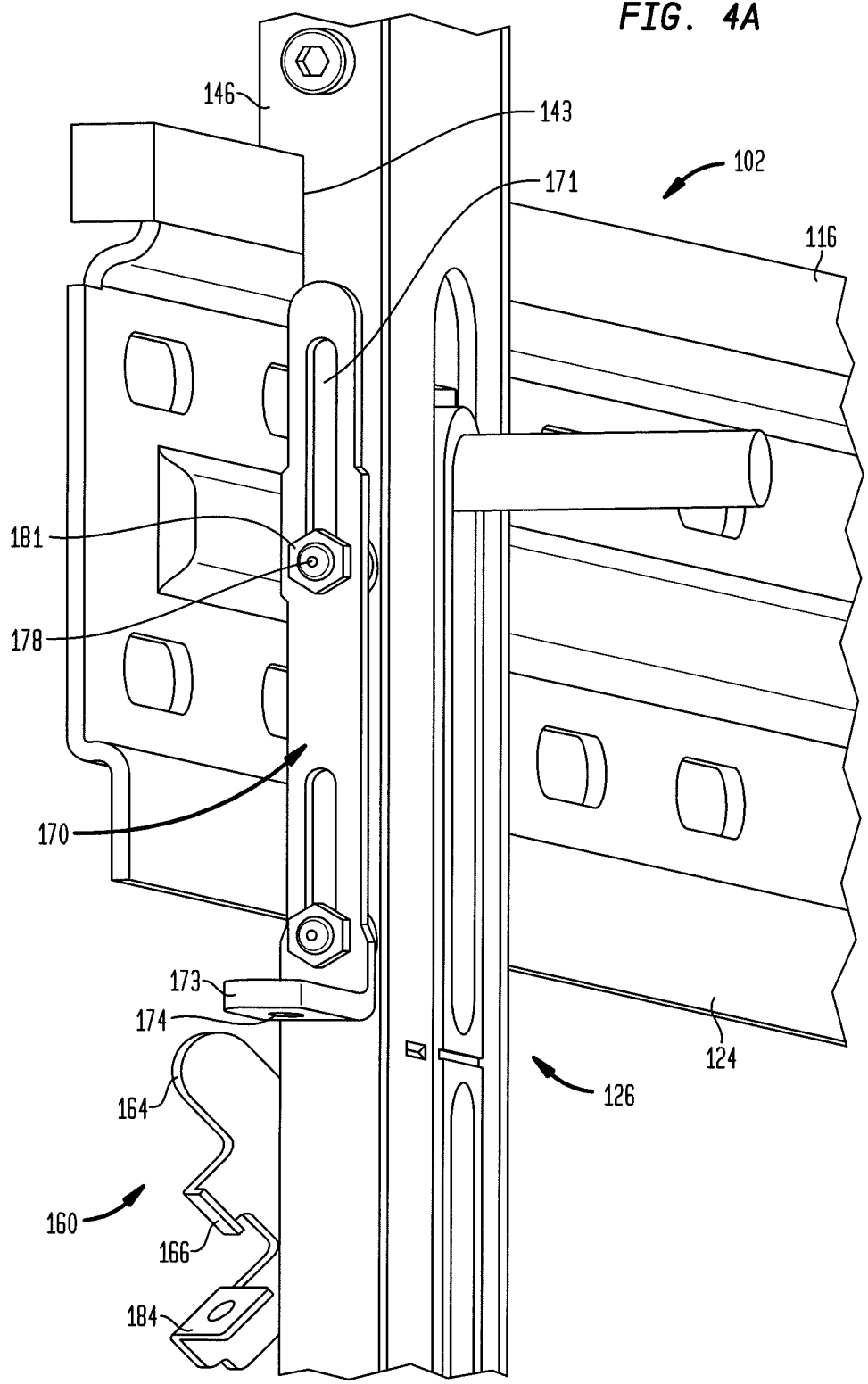
FIGS. 4A and 4B show enlarged, partial views of the monitor arm assembly of the system of FIGS. 1A and 1B mounted to, and being dismountable from, the wall plate.
Figure 4B:
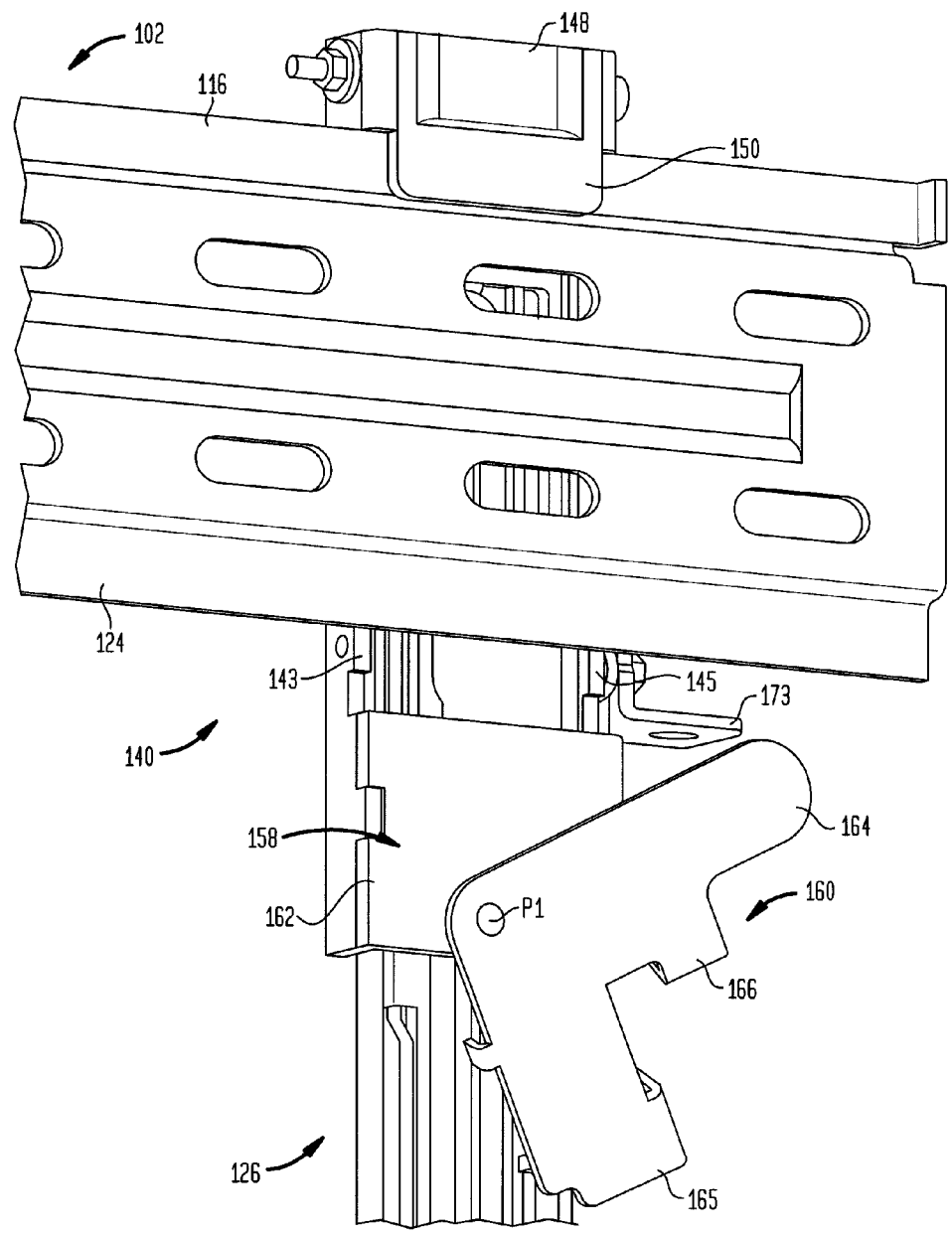

In one embodiment, the wall hook assembly 140 may include a lower back wall 158 extending between the sides 144, 146 at a lower end of the wall hook assembly 140. Referring to FIGS. 1B, 3B and 3C, the facing surfaces of the upper and lower back walls 148, 158 are spaced from each other a distance greater than the distance between the upper and lower ledges of the wall plate 102, so that the wall plate 102 may be moved into and out of the space between the lip 150 of the wall 148 and the lower wall 158. Referring to FIGS. 1B, 2B and 4B, the wall hook assembly 140 may be positioned so that the surfaces 143, 145 of the respective sides 144, 146 contact the ledges 116, 124 when the wall plate 102 is positioned in the space between the lip 150 and the lower wall 158 of the wall hook assembly. Once the wall hook assembly is placed in such position relative to the wall plate, and assuming the wall plate 102 is secured to a wall surface, the wall hook assembly 140 may then be moved downwardly relative to the wall plate 102 to position the upper ledge 116 between the lip 150 and the side walls 144, 146, and thus mount the monitor arm assembly to the wall plate 102 by means of the wall hook assembly 140 engaging with the upper ledge 116 of the wall plate.

In addition, referring to FIGS. 1B, 2B and 4B, the wall hook assembly 140 may include a generally L-shaped locking tab 160 pivotally secured to outer surface 162 of the lower back wall 158 at pivot point P1. The locking tab 160 includes end portions 164 and 165 and a flange 166. The locking tab 160 is adapted so that, when the monitor arm assembly is mounted to the wall plate by engagement of the wall hook assembly with the upper ledge 116 of the wall plate secured to a wall surface as described above, the locking tab 160 may be positioned so the end portion 164 opposes or does not oppose the lower ledge 124 of the wall plate 102. Referring to FIGS. 1B, 4A and 4B, the locking tab 160 may be rotated about the pivot point P1 to a position in which the end portion 164 does not obstruct movement of the wall plate 102 into and out of the space between the lip 150 and the wall 158, so as to provide that the wall hook assembly may be mounted to or dismounted from the wall plate. When the wall hook assembly is mounted to the wall plate by engagement with the upper ledge 116 as described above, the locking tab 160 may be rotated between a disengaged position in which the end portion 164 does not oppose the lower ledge 124 of the wall plate, as shown in FIGS. 4A and 4B, and an engaged position in which the end portion 164 opposes the lower ledge 124, as shown in FIGS. 4C and 4D.

Figure 4C:
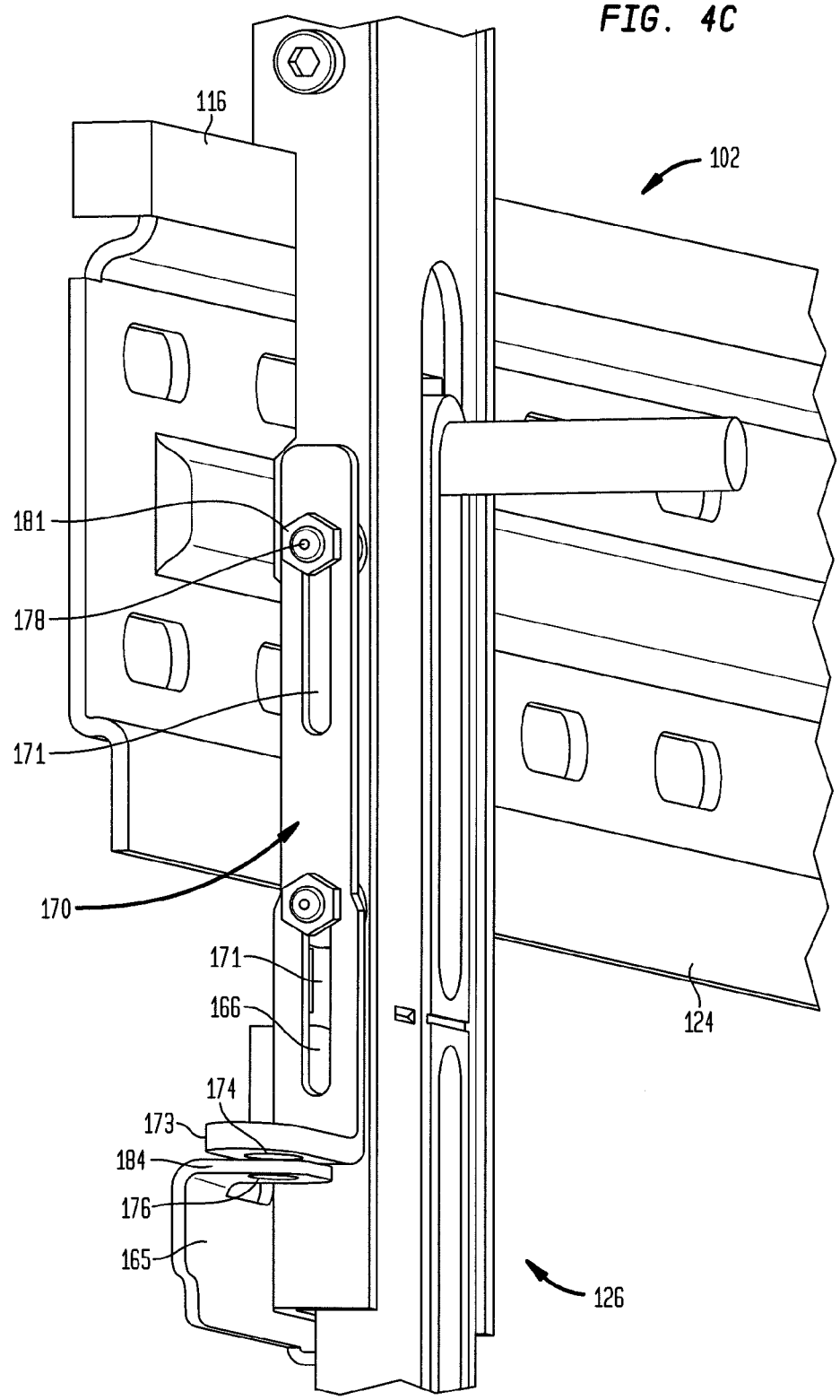
FIGS. 4C and 4D show enlarged, partial views of the monitor arm assembly of the system of FIGS. 1A and 1B mounted to, and prevented from being dismounted from, the wall plate.
Figure 4D:
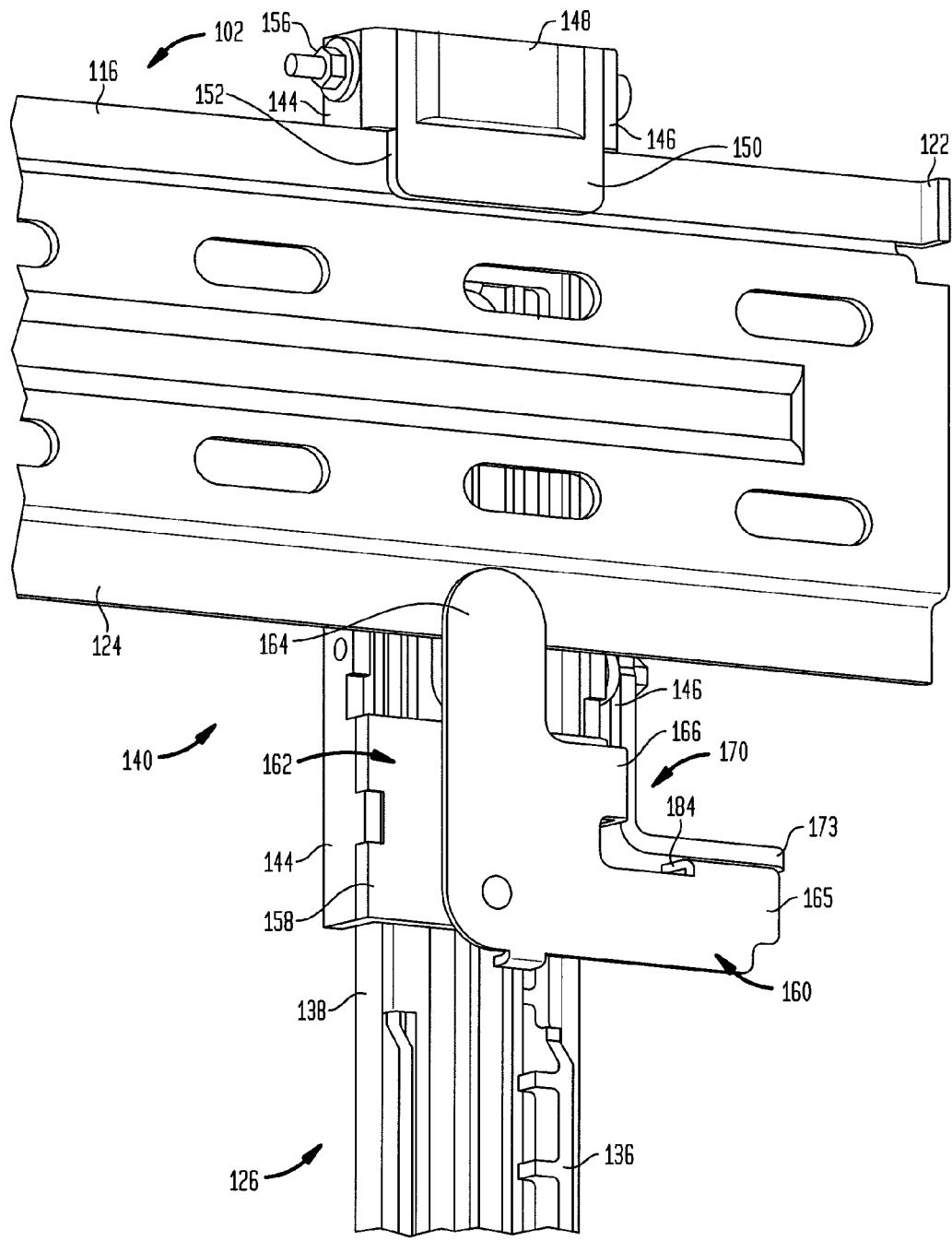

Referring to FIGS. 2B, 4C and 4D, when the wall hook assembly is engaged with the upper ledge 116 and the locking tab 160 is in an engaged position, the end portion 164 opposes the lower ledge 124 of the wall plate, such that the wall hook assembly cannot be lifted from the wall plate, so as to dismount the mounted monitor arm assembly, which includes the monitor arm pivotally secured to the wall hook assembly, from the wall plate. In other words, with the wall hook assembly engaged with upper ledge 116, the locking tab 160 may be rotated to a position in which the end portion 164 opposes the lower ledge of the wall plate, so as to prevent the mounted monitor arm assembly, which is mounted to the wall plate, from being dismounted from the wall plate.

In a further embodiment, referring to FIGS. 3A, 3D, 3E, 4A and 4C, the wall hook assembly 140 may include a locking bar 170 attached to the side 146 of the wall hook assembly 140 so as to be slidable along a length of the side 146. In one embodiment, the locking bar 170 includes openings 171 in the form of slots extending along its length. Threaded bolts 178 may extend from the side 146 through spacers 179 and the openings 171, and nuts 181 may be secured to the ends of the bolts 178 to provide that the locking bar may slide between the nuts and spacers along a length of the side 146.

The locking bar 170 is slidable along the length of the side 144 to positions that may or may not obstruct rotation of the locking tab 160. Referring to FIGS. 4A and 4B, the locking bar 170 is slidable to an unlocked position, in which the locking bar does not obstruct rotation of the locking tab 160. Hence, with the locking bar in an unlocked position, the locking tab 160 may be rotated between an engaged position and disengaged position with respect to the wall plate, as discussed above. In addition, referring to FIGS. 2B, 4C and 4D, the locking bar 170 is slidable to a locked position to prevent rotation of the locking tab 160, by opposing the flange 166 of the locking tab. For example, when the locking tab 160 is an engaged position with respect to the wall plate as discussed above, the locking bar 170 may be slid to a locked position in which the locking bar 170 is positioned opposing the flange 166 of the locking tab, which is adjacent to the side 146, to prevent rotation of the locking tab from the engaged position to a disengaged position.

In one embodiment, the locking bar 170 may be resiliently secured to the side of the wall hook assembly, by the spacers 179 and the nuts 181, such that after the locking bar 170 is slid into a locked position, the bar 170 is biased against the flange 166 and, thus, maintained in the locked position.

In a further embodiment, referring to FIGS. 3D, 3E, 4C and 4D, the locking tab 160 may include a flange 184 extending from the end portion 165, and a lower end of the locking bar 170 may include a flange 173 extending therefrom. The flanges 173 and 184 are adapted to oppose each other, when the locking tab 160 is positioned in an engaged position with the end portion 164 opposing the ledge 124 and the locking bar 170 is in a locked position. In addition, the flange 173 may include an opening 174, and the flange 184 of the locking tab 160 may include an opening 176. The respective openings 174, 176 of the flanges 173, 184 are adapted such that, when the locking tab 160 is positioned with the end portion 164 opposing the ledge 124 and the locking bar 170 is in a locked position, the openings 174, 176 are aligned and a padlock may be passed through the aligned openings to lock the mounted monitor arm assembly to the wall plate.

An exemplary mounting of the monitor arm assembly to the wall plate using a wall hook assembly, in accordance with aspects of the present invention, so that the monitor arm assembly may be prevented from being dismounted from the wall plate, is now described. Referring to FIGS. 2A, 2B, 4A and 4B, the locking tab 160 may be rotated to a position that allows the wall plate 102 to be received between the lip 150 and the wall 158 of the wall hook assembly, and the locking bar 170 may be slid to an unlocked position, such that rotation of the locking tab is not obstructed by the locking bar. The monitor arm assembly, such as the assembly 126, may then be moved in relation to the wall plate to position the wall plate 102 between the lip 150 and wall 158. With the sides 136, 138 of the monitor arm 129 held flush against the front side 108 of the wall plate, which is secured to a wall surface, the monitor arm may be lowered onto the wall plate, so that the ledge 116 is received between the lip 150 and the sides 144, 146 of the wall hook assembly 140. As a result, the wall hook assembly 140 is engaged with the ledge 116, thereby mounting the monitor arm 129, and thus the monitor arm assembly including the monitor arm 129, to the wall plate. The locking tab 160 may then be rotated into a position in which the end portion 164 opposes the lower ledge 124 of the wall plate. The lower ledge 124, thus, is positioned between the end portion 164 and the sides 144, 146, as shown in FIG. 2B and 4B, such that the wall hook assembly is engaged with the wall plate at both the ledges 116 and 124. The locking bar 170 may then be slid downward along the side 146 to a locked position, in which the flange 166 of the locking tab 160 is between the locking bar 170 and the side 146. In the locked position, the locking bar 170 obstructs rotation of the locking tab 160 at the flange 166. Based on the force of gravity and also the resilient attachment of the locking bar to the side 144, the locking bar 170 may be maintained in the locked position. The wall hook assembly, and thus the monitor arm assembly having its monitor arm pivotally secured to the wall hook assembly, is mounted to the wall plate, based on the engagement of the wall hook assembly with the ledge 116. In addition, the wall hook assembly is engaged with the ledge 124 of the wall plate by means of the locking tab, and the locking bar is positioned to obstruct rotation of the locking tab from an engaged position, such that the monitor arm, and thus the mounted monitor arm assembly including the monitor arm, is prevented from being dismounted from the wall plate.

Figure 7A:
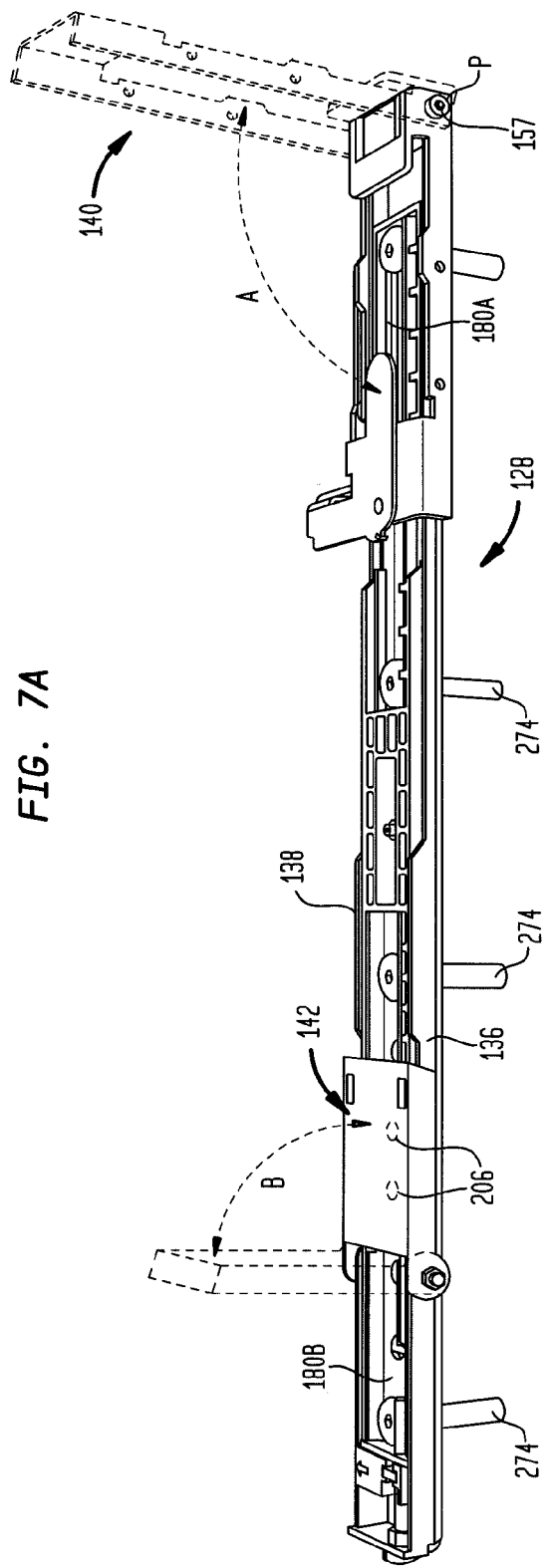
FIG. 7A shows a view of the monitor arm assembly of the system of FIGS. 1A and 1B, with the wall hook assembly and the spacer element rotated away from the monitor arm.
Figure 7B:
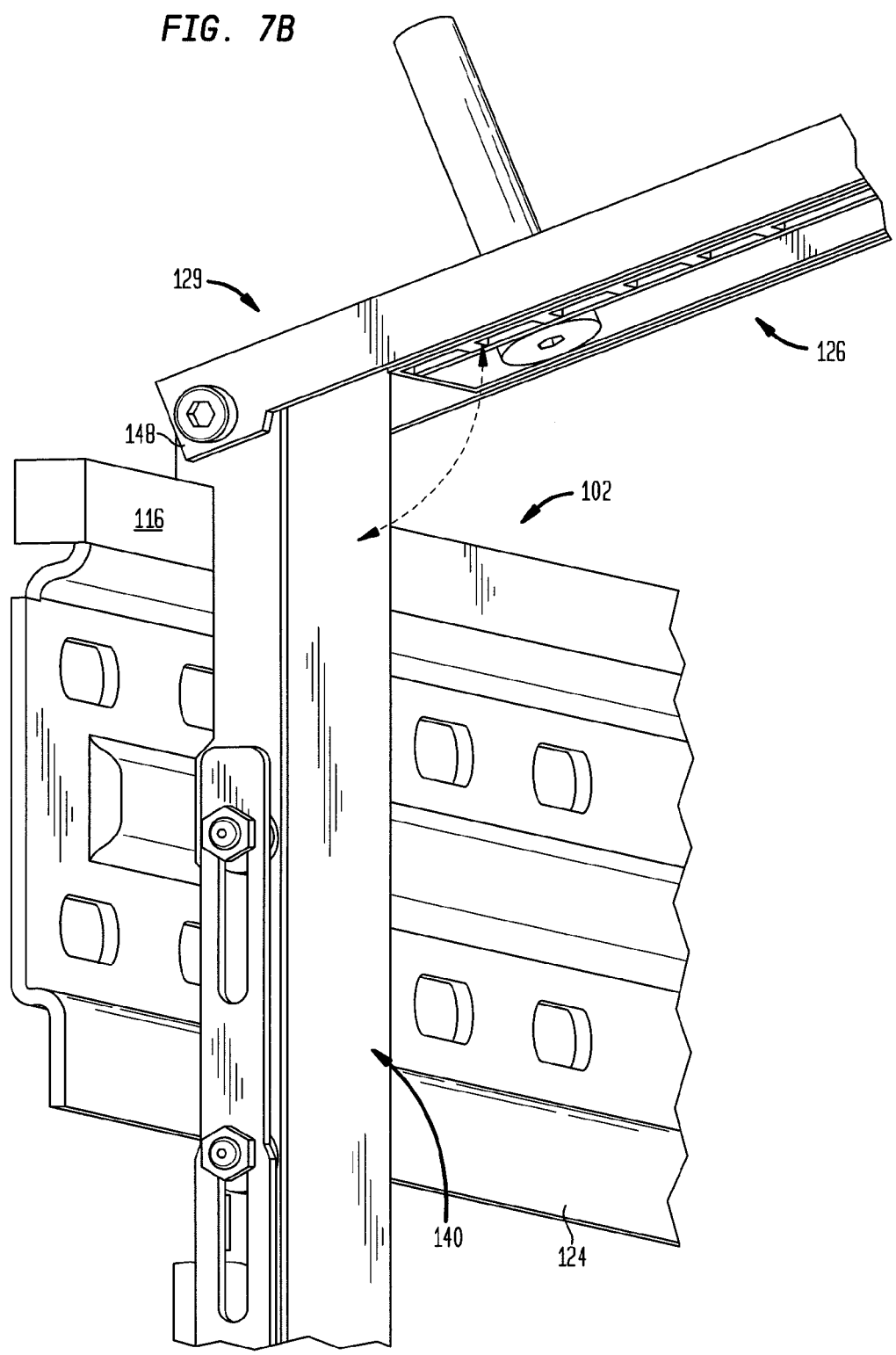
FIG. 7B shows an enlarged, partial view of the monitor arm assembly of the system of FIGS. 1A and 1B mounted to, and prevented from being dismounted from, the wall plate, with the monitor arm rotated away from the wall plate.

With the monitor arm assembly mounted to the wall plate by the wall hook assembly, as shown in FIGS. 2B and 4D, the monitor arm may be rotated away from the wall hook assembly, and thus the wall plate to which the wall hook assembly is engaged, as shown in FIG. 7B, and the monitor arm assembly is prevented from being dismounted from the wall plate. The monitor arm assembly may be rotatable away from the wall hook assembly to the extent of interaction between the monitor arm with a flat panel display, such as flat panel television, secured thereto, and a stopping structure, such as a wall surface or other structure to which the wall hook assembly may be pivotally mounted. Consequently, after a flat panel television secured to a monitor arm assembly is mounted to a wall plate using the wall hook assembly of the system of the present invention, the television may be rotated with the monitor arm tens of degrees away from the wall surface to increase the space between the back surface of the television and the wall, while the mounted television is prevented from becoming dismounted from the wall plate. Advantageously, increased space is available for connecting wires and cables to the back surface of the television while the television is mounted to the wall plate, and the mounted television is prevented from becoming dismounted from the wall plate when the mounted television is rotated away from the wall surface.

In one embodiment, the monitor arm assembly may include an engagement assembly pivotally mounted thereto and engagable with a mounting system element, such as an articulating arm of a display mounting system which is mounted to a wall plate secured to a wall surface. When the engagement assembly is engaged with the mounting system element, the monitor arm assembly with the flat panel display secured thereto may be rotatable away from the mounting system element to the extent interaction between the flat panel display with the monitor arm assembly and a stopping structure, such as the mounting system element itself or another structure, may allow.

Figure 6:
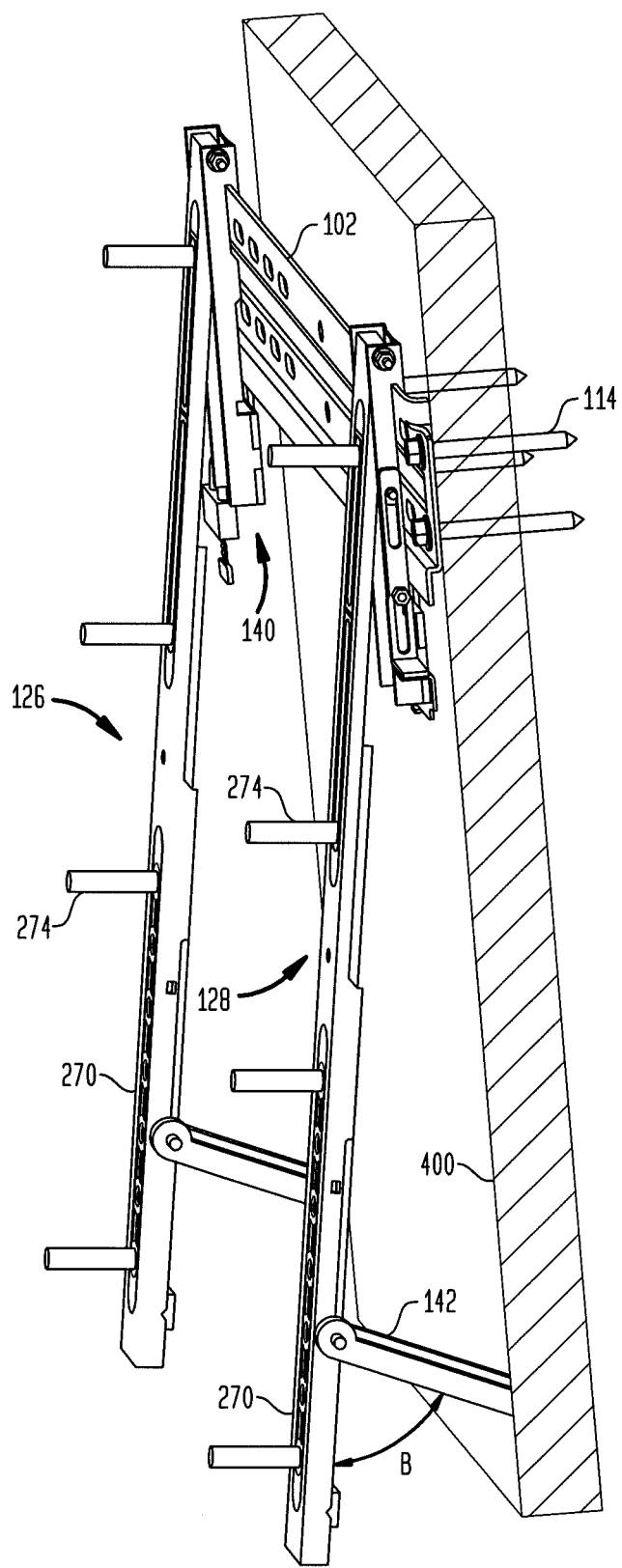
FIG. 6 shows a perspective view of the system of FIGS. 1A and 1B in an assembled configuration, with the monitor arm assembly mounted to, and prevented from being dismounted from, the wall plate.

Referring to FIGS. 1B, 2B and 3A, in one embodiment, a spacer element 142 may be pivotally attached to the sides 136, 138 of the monitor arm 129 at a lower end of the mounting arm, so the spacer element 142 may be rotated in relation to the monitor arm 129. Referring to FIG. 6, the pivotal attachment of the spacer element 142 to the monitor arm 129 is adapted such that the spacer element 142 may be rotated away from the monitor arm 129 at least about B degrees, where B is about 95 degrees, to space the lower end of the mounted television from a wall surface.

Referring to FIGS. 3A and 5A-5E, in one embodiment each monitor arm assembly of the system 10 may include a leveling assembly 200. The leveling assembly 200 may include an upper support 202 and a lower support 203, which are desirably formed from metal. The upper support 202 includes one or more openings in the form of slots 204 extending therethrough and arranged along the length of the support 202. In addition, the lower support 203 includes one or more openings in the form of apertures 206 extending therethrough and arranged spaced from each other along the length of the support 203. The lower support 203 further includes a lower end wall 208 extending orthogonally from a back wall 210 of the support 203, and an aperture 212 extending through the back wall 208.

In addition, the leveling assembly may include a longitudinally extending leveling bracket 220, desirably formed from plastic material, having a back wall 222, opposing side walls 231 and 233, a top wall 225 and a bottom wall 227. The back wall 222 includes an upper portion 232 having one or more slots 228 extending along the length of the bracket 220, and a lower portion 234 having apertures 230 arranged spaced along the length of the bracket 220. The upper and lower portions 232, 234 are adapted to receive and retain, respectively, the upper and lower supports 202, 203 in interior areas defined by the opposing side walls 231, 233, the back wall 222 and the top and bottom walls 225, 227, with the apertures 206, 230 and the slots 204, 228 being respectively aligned. In one embodiment, the walls of the bracket 220 defining the upper and lower portions 232, 234 include retaining tabs 235 adapted to retain the upper and lower supports 202 within the respective interior areas of the portions 232, 234.

In addition, the monitor arm 129 may be adapted to have the leveling assembly 200 be secured to and extend along a length of the back surface 134 of the back wall 130 of the monitor arm 129, and a portion of the leveling assembly 200 may be disposed within the slots 180A, 180B of the monitor arm 129. In the exemplary illustrated embodiment, the monitor 129 may be adapted to receive substantially all of the leveling assembly 200 within an interior area 240 defined by the back wall 130 and the sides 136, 138 of the monitor arm 129. In addition, the leveling assembly 200 may be retained within the interior area 240 to be slidable along a length of and relative to the monitor arm 129, within the interior area 240. In one embodiment, the leveling bracket 220 may include a slot 236 extending lengthwise between the top and bottom ends of the bracket 220 and adapted so that a threaded rod 239 extending from the back wall 130 of the monitor arm 129 may pass therethough when the bracket 220 is received in the interior area 240. A nut 241 may be threaded onto the projecting end of the rod 239 to attach the bracket 220 to the monitor arm. In one embodiment, the slot 236 is disposed centrally between the top and bottom ends of the bracket 220. The bracket 220, by attachment at the slot 236 to the monitor arm, is slidable, relative to the monitor arm, along a length of the monitor arm equal to the length of the slot 236. Such slidable attachment of the bracket 220 to the monitor arm 129 provides that the leveling assembly 200, which includes the bracket 220 and the supports 202, 203, may slide freely, within the interior area 240 of the monitor arm, along a length of and relative to the monitor arm 129.

Referring to FIGS. 3A, 5D and 5E, the back wall 222 of the leveling bracket 220 may include, at each of the upper and lower portions 232, 234, a projecting portion 270 extending away from a front surface 224 of the back wall 222 and which defines a portion of the slots 228 and the apertures 230. The projecting portions 270 at the respective upper and lower portions 232 may be arranged within the slots 180A, 180B of the monitor arm. In addition, the projecting portions 270 may have a front surface 272 and extend along lengths of the bracket 220 which are less than the lengths of the respective slots 180A, 180B.

The leveling assembly 200 may be secured to a back surface of a flat panel television (not shown) by screws 274 extending through the aligned apertures and slots of the supports and the bracket 220, and then through the slots 180 of the monitor arm. In one embodiment, the bracket 220 is adapted so the front surfaces 272 of the projecting portions 270 are spaced from the front surface 132 of the back wall 130 of the monitor arm, when the leveling assembly is secured to a flat panel television by the screws 274, such that the back surface of the television contacts only the front surfaces 272 of the projecting portions 270. The projecting portions 270, thus, may space, from the front surface 132 of the back wall 130 of the monitor arm, the back surface of the television, to provide that the television may be moved together with the leveling assembly along a length of the monitor arm, without the television contacting the back wall of the monitor arm 129.

In one embodiment, a manually operable actuator assembly may be coupled to the leveling assembly 200 to permit a user to control slidable movement of the leveling assembly 200, and a flat panel television mounted thereto, along a length of and relative to the monitor arm 129. Referring to FIGS. 5A and 5C, in one embodiment, an actuator assembly 258 may be in the form of a screw capture or lock mechanism which includes a threaded bolt 260 passing through an aperture 262 at bottom wall 131 of the monitor arm 129, a snap ring 261 engaging an annular groove in the bolt 260 adjacent the wall 131, a lock nut 264 held within a retaining element 266 of the bracket 220 at the lower end wall 227, and an aperture 212 in the lower end wall 208 of the support 203. The lock mechanism allows the lock nut 264 to move along the length of the bolt 260 when the bolt is rotated, while preventing the bolt 260 from moving axially through the aperture 262 in the bottom wall 131 of the monitor arm 129. The actuator assembly 258 is adapted such that, when the bolt 260 is rotated in a clockwise direction, the bracket 220 with the supports 202, 203, may slide along a length of and relative to the monitor 129, in the direction of the lower end of the monitor arm 129. In addition, when the bolt 260 is rotated in a counterclockwise direction, the bracket 220 with the supports 202, 203 may slide along the length of and relative to the monitor 129, in the direction of the upper end of the monitor arm 129. In one embodiment, the bolt 260 at its end includes a groove 280 for engagement with a head of a screwdriver or a hex drive tool.

Referring to FIGS. 5A-5E and 6, a flat panel television (not shown) may be attached to the monitor arm assembly by screws 274 that extend through the respectively aligned slots and apertures of the leveling assembly, and the slots 180 of the monitor arm, to secure the bracket 220 and the supports 202, 203 of the leveling assembly to the back surface of the television, with the back surface of the television spaced from the monitor arms by the projecting portions 272. Advantageously, in an assembled configuration of the system 100, such as shown in FIG. 6, with a flat panel television secured to a monitor arm assembly mounted to a wall plate secured to a wall surface, the leveling assembly of the monitor arm assembly may be freely slidable, at the back surface 134 of the back wall 130 and within the openings 180 of the monitor arm 129, along a length of and in relation to the monitor arm 129, to adjust the vertical position of the television in relation to the wall surface, by operation of the actuator assembly. The bolt 260 of the actuator assembly may be rotated clockwise or counterclockwise, as desired, to precisely adjust the horizontal leveling of the television at the side secured to the corresponding monitor arm assembly. The back surface of the television, which is secured against the projecting portions 270 by the screws 274, moves vertically together with the leveling assembly relative to the monitor arm, without contacting the monitor arm. The freely slidable leveling assembly, which may be substantially contained within an interior area of the monitor arm, advantageously provides an assembly of relatively small size that may be used to achieve a desired horizontal leveling of a mounted television.

In a further embodiment, referring to FIGS. 1A, 2A and 3A, the front surface 132 of the back wall 130 of each of the monitor arms may include indicia 300 arranged at a same position along the length of monitor arms in relation to their respective lower ends. The indicia 300 provides a reference point to which an aperture 206 of the bracket 220 of the leveling assembly may be initially aligned before a flat panel television is secured to the monitor arm assemblies. For example, before the monitor arm assemblies with a flat panel television secured thereto are mounted to the wall plate, the monitor arm assemblies may be arranged in relation to the television so that the positions of the apertures of the respective leveling assemblies at the lower ends of the monitor arm assemblies are matched. The matching of respective apertures of the leveling assemblies provides a coarse horizontal leveling for the television to be mounted to the wall plate by the monitor arm assemblies, and, after the television is mounted to the wall plate, the individual leveling assemblies may be adjusted, as suitable, to provide a more precise horizontal leveling of the television in the mounted environment.

In one embodiment, the bracket 220 and lower and upper supports of the leveling assembly may be adapted such that one or both include apertures or slots for receiving the screws 274.

Referring to FIGS. 1A-1B, 2A-2B, 3A-3E, 4A-4D, 5A-5E, 6 and 7A-7B, an exemplary installation of the inventive mounting system 100 for mounting a flat panel television to a wall surface, in accordance with aspects of the present invention, is described. The wall plate 102 may be secured at a desired location on a wall surface 400 (see FIG. 6) by screws 114 passing through the openings 112. The positions of the leveling assemblies 200 within the respective monitor arm assemblies may be adjusted by operation of the actuator assembly, as needed, with reference to the leveling indicia 300, so that the same apertures in the leveling assemblies of the respective monitor arm assemblies are spaced the same distance from the lower ends of the monitor arms.

After adjustment of one or more of the leveling assemblies to obtain the same spacing of the same respective apertures relative to the lower ends of the respective monitor arms, the wall hook assembly 140 and the spacer element 142 may be rotated away from the sides of the monitor arm, such at least about 90 degrees or more, as shown in FIG. 7A. Such positioning of the wall hook assembly and the spacer element eases securing of the monitor arm assemblies to the back surface of the television by screws 274, because the apertures and slots of the leveling assembly, and also the slots 180 of the monitor, through which the screws 274 need to pass are not obstructed by the wall hook assembly and the spacer element. Advantageously, the wall hook assembly and the spacer element may be rotated, relative to the monitor arm, at any angle up to about 90 degrees, to provide unobstructed access to the apertures and slots of the leveling assembly 200 along the entire length of the monitor arm.

When a flat panel television has been secured to the leveling assembly, and thus to the monitor arm assembly including the leveling assembly, by the screws 274, the projecting portions 270 space the front surface 132 of the back wall 130 of the monitor arm from the back surface of the television. This advantageously permits the television to be slid, with relative ease, along a length of the monitor arm to adjust its horizontal leveling, by operation of the leveling assembly 200 using the manual actuator assembly, after the monitoring arm assembly with the television secured thereto has been mounted to the wall plate.

After the television is secured to the monitor arm assemblies, the locking tabs of the wall hook assemblies may be placed in a disengaged position and the locking bar may be placed in the unlocked position, such as shown in FIGS. 4A and 4B. The wall hook assemblies of the respective monitor arm assemblies may then be engaged with the top ledge of the wall plate at the respective lips 150, so as to mount the television to the wall plate. The television may be rotated away from the wall plate at the pivot point at the upper ends of the monitor arms, and thus be rotated away from the wall surface to which the wall plate is secured, while remaining mounted on the wall plate, based on the engagement of the wall hook assemblies with the upper ledge of the wall plate.

In addition, with the television rotated away from the wall surface at the upper ends of the monitor arms, the spacer elements may be rotated away from the monitor arms to oppose and contact the wall surface. The length of the spacer elements may be adapted such that the lower ends of the monitor arms are spaced a sufficient distance from the wall surface to allow a user to access the wall hook assemblies, and in particular the locking tabs and locking bars thereof, after the wall hook assemblies are mounted at the upper ledge of the wall plate.

With the television together with the mounted monitor arms maintained spaced from the wall surface by the spacer elements, the locking tabs may be rotated to an engaged position in which the end portions 164 oppose the lower ledge 124. Then, with the locking tabs in the engaged position, the locking bars may be slid downwardly to a locked position, in which the locking bars oppose the flanges 166 of the respective locking tabs, to prevent rotation of the locking tabs from the engaged position to the disengaged position. In such locked position of the locking bars, the wall hook assemblies are now engaged with the upper and lower ledges of the wall plate, such that the mounted monitor arm assemblies cannot be dismounted from the wall plate, such as by lifting of the television which may occur when the monitor arms with the television are rotated away from the wall surface. For example, the monitor arms together with the television may be rotated away from the wall surface, such as up to about 90 degrees, as shown in FIG. 7B, without the mounted television becoming dismounted from the wall plate. The ability to rotate the mounted television to such an extent, without the television being dismounted from the wall plate, provides that a relatively large access space between the back surface of the mounted television and the wall surface may be obtained. This large access space eases connecting wires and cables to the back surface when the television is mounted to the wall plate.

In one embodiment, with the wall hook assemblies preventing the mounted television from being dismounted from the wall plate by being lifted from the wall plate, the mounted television may also be prevented from being dismounted at the sides of the wall plate by the flanges 122 of the wall plate. When the monitor arm assembly is moved horizontally to a side of the wall plate, the flanges 122 oppose the stop surface 152 of the lip 150 of the wall hook assembly, to prevent dismounting of the mounted television at the side of the wall plate.

After cables and wires are installed at the back surface of the mounted television, the monitor arm assemblies may be allowed to rotate in the direction of the wall surface, so that the monitor arms are received in interior areas of respective wall hook assemblies and the mounted television hangs adjacent the wall surface. The mounted television, then, may be observed in its environment to determine if a vertical adjustment is needed, at one or both sides, to obtain a desired horizontal leveling of the television.

To adjust the horizontal leveling of the mounted television, each of the monitor arms 129, which may have a leveling assembly secured at the back surface 132 of the back wall 130 of the monitor arm 129, may be rotated away from the wall plate, and the spacer elements 142 may be rotated away from the monitor arms and positioned against the wall surface to maintain the television display spaced from the wall surface, similarly as descried above. By positioning the mounted television spaced away from the wall plate (wall surface) in this manner, a space to access the actuator assembly for the leveling assembly at the lower end of the monitor arm is provided. A tool, such as a screwdriver, may be used to rotate the bolt 260 of the actuator assembly of one or both of the monitor arm assemblies, to slide the leveling assembly, and thus the television secured to the leveling assembly and spaced from the monitor arm by the projection portions 270, along a length of the monitor arm to obtain a desired horizontal leveling of the television.

Consequently, the present invention advantageously provides that a flat panel television may be easily secured to a monitor arm assembly, the television secured to the monitor arm assembly may be mounted to the wall plate to prevent dismounting of the mounted television, such as when the back surface of the television is accessed by rotating the television away from the wall surface, and the horizontal leveling of the mounted television may be adjusted by a leveling assembly arranged at the back surface of the back wall of the monitor arm of the monitor arm assembly which is pivotally secured to a wall hook assembly that mounts the television to the wall plate.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A flat panel display mounting system comprising:
a mounting element; and
a monitor arm assembly including a monitor arm mountable to the mounting element, the monitor arm having an opening, and a leveling assembly coupled to the monitor arm and arranged within the opening thereof, the leveling assembly being movable relative to the monitor arm within the opening and along a length of the monitor arm,
the leveling assembly including a display mounting portion adapted to mount a flat panel display thereon, whereby the leveling assembly can be adjusted with the mounted display to obtain a desired location of the mounted display,
wherein the leveling assembly defines a slot at which the leveling assembly is slidably coupled to the monitor arm.

2. The system of claim 1, wherein the monitor arm includes a rod unit slidably coupling the leveling assembly to the monitor arm at the slot.

3. The system of claim 1, wherein the leveling assembly includes a support associated with the display mounting portion.

4. The system of claim 3, wherein the support is made from metal material.

5. The system of claim 1, wherein the leveling assembly extends longitudinally between first and second ends and is slidably coupled to the monitor arm between the first and second ends.

6. The system of claim 1, wherein the leveling assembly includes plastic material.

7. The system of claim 1, wherein the display mounting portion has an opening extending therethrough at which the display can be mounted to the leveling assembly.

8. The system of claim 1 further comprising:
a plurality of the monitor arm assemblies.

9. The system of claim 1, wherein the mounting element is a wall plate.

10. A flat panel display mounting system comprising:
a mounting element;
a monitor arm assembly including a monitor arm mountable to the mounting element, the monitor arm having an opening, and a leveling assembly coupled to the monitor arm and arranged within the opening thereof, the leveling assembly being movable relative to the monitor arm within the opening and along a length of the monitor arm,
the leveling assembly including a display mounting portion adapted to mount a flat panel display thereon, whereby the leveling assembly can be adjusted with the mounted display to obtain a desired location of the mounted display; and
an actuator unit operable to move the leveling assembly along the length of the monitor arm.

11. The system of claim 10, wherein the actuator unit includes a rotatable element retained in a capture mechanism of the leveling assembly adapted to provide that the leveling assembly moves along the length of the monitor arm upon rotation of the rotatable element.

12. The system of claim 10, wherein the leveling assembly includes a support associated with the display mounting portion.

13. The system of claim 10, wherein the display mounting portion has an opening extending therethrough at which the display can be mounted to the leveling assembly.

14. A flat panel display mounting system comprising:
a mounting element; and
a monitor arm assembly including a monitor arm mountable to the mounting element, the monitor arm having an opening, and a leveling assembly coupled to the monitor arm and arranged within the opening thereof, the leveling assembly being movable relative to the monitor arm within the opening and along a length of the monitor arm,
the leveling assembly including a display mounting portion adapted to mount a flat panel display thereon, whereby the leveling assembly can be adjusted with the mounted display to obtain a desired location of the mounted display,
wherein the leveling assembly extends longitudinally between first and second ends, wherein the display mounting portion has at least one slot at the first end and at least one aperture at the second end.

15. A flat panel display mounting system comprising:
a mounting element; and
a monitor arm assembly including a monitor arm mountable to the mounting element, the monitor arm having an opening, and a leveling assembly coupled to the monitor arm and arranged within the opening thereof, the leveling assembly being movable relative to the monitor arm within the opening and along a length of the monitor arm,
the leveling assembly including a display mounting portion adapted to mount a flat panel display thereon, whereby the leveling assembly can be adjusted with the mounted display to obtain a desired location of the mounted display,
wherein an outer surface of the monitor arm includes leveling indicia.

16. A flat panel display mounting system comprising:
a mounting element; and
a monitor arm assembly including a monitor arm mountable to the mounting element, the monitor arm having an opening, and a leveling assembly coupled to the monitor arm and arranged within the opening thereof, the leveling assembly being movable relative to the monitor arm within the opening and along a length of the monitor arm,
the leveling assembly including a display mounting portion adapted to mount a flat panel display thereon, whereby the leveling assembly can be adjusted with the mounted display to obtain a desired location of the mounted display,
wherein the monitor arm includes a back wall having opposing first and second surfaces, the first surface facing the mounting element when the monitor arm is mounted to the mounting element, and wherein the display mounting portion includes a projecting portion adapted to space the mounted display from the second surface of the monitor arm.

17. The system of claim 16, wherein the second surface of the monitor arm has an opening aligned with the projecting portion.

18. The system of claim 17, wherein the projecting portion defines an opening extending through the leveling assembly at which the display can be mounted to the leveling assembly.

19. The system of claim 16, wherein the leveling assembly includes a support associated with the display mounting portion.

20. The system of claim 16, wherein the display mounting portion has an opening extending therethrough at which the display can be mounted to the leveling assembly.

21. A flat panel display mounting system comprising:
a mounting element; and
a monitor arm assembly including a monitor arm mountable to the mounting element, the monitor arm having opening, and a leveling assembly longitudinally extending between first and second ends and arranged within the opening of the monitor arm, the leveling assembly including a portion disposed centrally between the first and second ends and having a longitudinally extending slot at which the monitor arm is coupled to the leveling assembly, the leveling assembly being movable relative to the monitor arm within the opening and along a length of the monitor arm,
the leveling assembly including a display mounting portion disposed between the portion with the slot and the first end or the second end and adapted to mount a flat panel display thereon, whereby the leveling assembly can be adjusted with the mounted display to obtain a desired location of the mounted display.

22. The system of claim 21, wherein the display mounting portion has an opening extending therethrough at which the display can be mounted to the leveling assembly.

23. The system of claim 21, wherein the slot of the leveling assembly has a length equal to the length of the monitor arm along which the leveling assembly can be moved.

24. The system of claim 21, wherein the display mounting portion includes a projecting portion aligned with an opening in the monitor arm and adapted to space the mounted display from the monitor arm.

25. The system of claim 21, wherein the mounting element is a wall plate.

* * * * *